United States Patent [19]
Inoh et al.

[11] Patent Number: 5,620,908
[45] Date of Patent: Apr. 15, 1997

[54] MANUFACTURING METHOD OF SEMICONDUCTOR DEVICE COMPRISING BICMOS TRANSISTOR

[75] Inventors: Kazumi Inoh, Yokohama; Yasuhiro Katsumata, Chigasaki; Satoshi Matsuda; Chihiro Yoshino, both of Yokohama, all of Japan

[73] Assignee: Kabushiki Kaisha Toshiba, Kawasaki, Japan

[21] Appl. No.: 530,578

[22] Filed: Sep. 19, 1995

[30] Foreign Application Priority Data

Sep. 19, 1994 [JP] Japan .................................. 6-223800

[51] Int. Cl.$^6$ .................................................. H01L 21/265
[52] U.S. Cl. ......................... 438/207; 438/341; 438/365
[58] Field of Search .............................. 437/31, 34, 59, 437/162; 148/DIG. 9

[56] References Cited

U.S. PATENT DOCUMENTS

| | | | |
|---|---|---|---|
| 5,047,358 | 9/1991 | Kosiak et al. | 437/34 |
| 5,204,276 | 4/1993 | Nakajima et al. | 437/31 |
| 5,296,391 | 3/1994 | Sato et al. | 437/31 |
| 5,441,903 | 8/1995 | Eklund | 148/DIG. 9 |
| 5,494,836 | 2/1996 | Imai | 437/31 |

FOREIGN PATENT DOCUMENTS 3-250660  11/1991  Japan .

*Primary Examiner*—Tuan H. Nguyen
*Attorney, Agent, or Firm*—Oblon, Spivak, McClelland, Maier & Neustadt, P.C.

[57] ABSTRACT

A method of manufacturing a semiconductor device including selectively forming an element-isolating insulating layer on a surface of a semiconductor substrate to define active regions; forming a first insulating layer and removing respective portions thereof on surfaces of a second conductive type active region and a first active region of a first conductive type; oxidizing to form a gate oxide layer; forming and patterning a conductive layer to form a gate electrodes of MOS transistors and a base-extracting electrode of a bipolar transistor; forming an opening, in the base-extracting electrode, and a side wall insulating layer on an inner wall of the opening; removing first and second portions of the insulating layer to form an overhung portion; epitaxially growing a second conductive type semiconductor layer using the base-extracting electrode and active region of the first conductive type as a seed crystal; and selectively forming a first conductive type semiconductor layer that is to become an emitter that does not contact the base-extracting electrode.

4 Claims, 13 Drawing Sheets

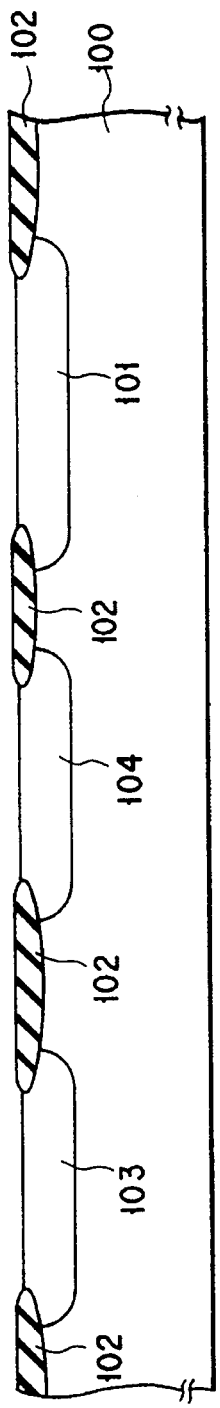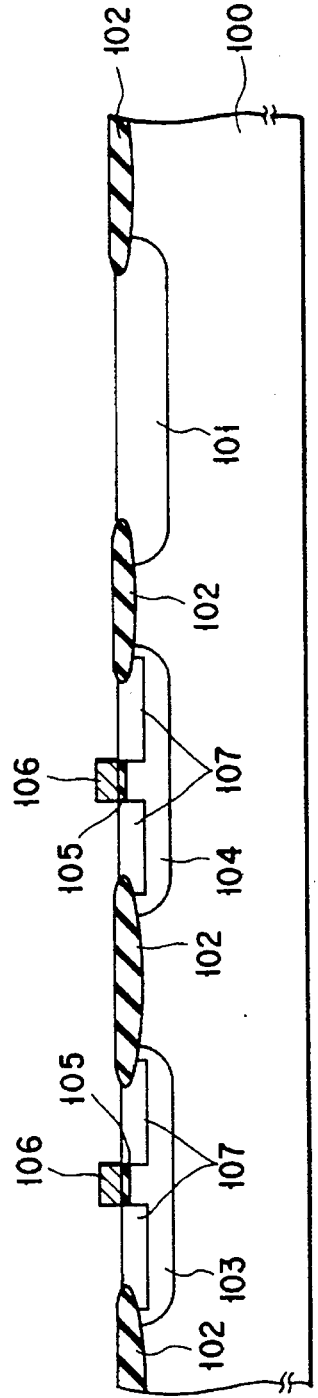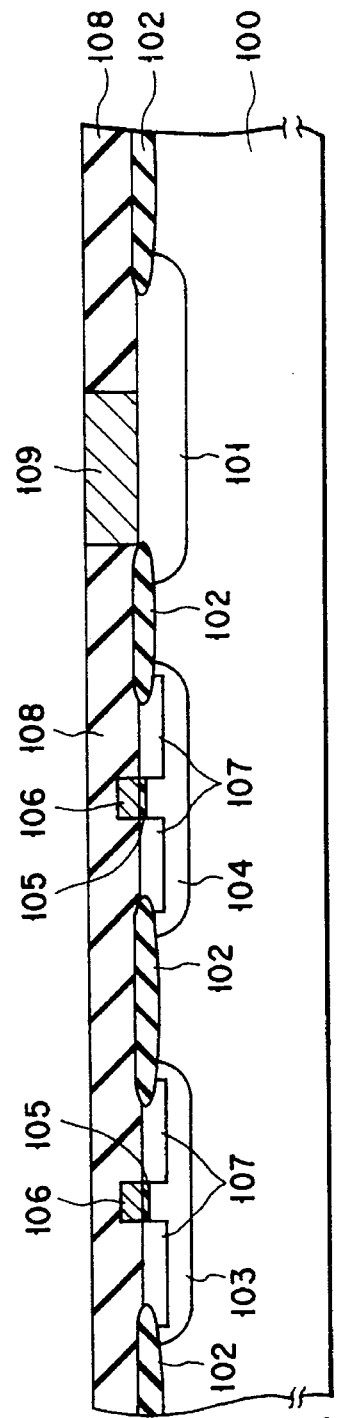

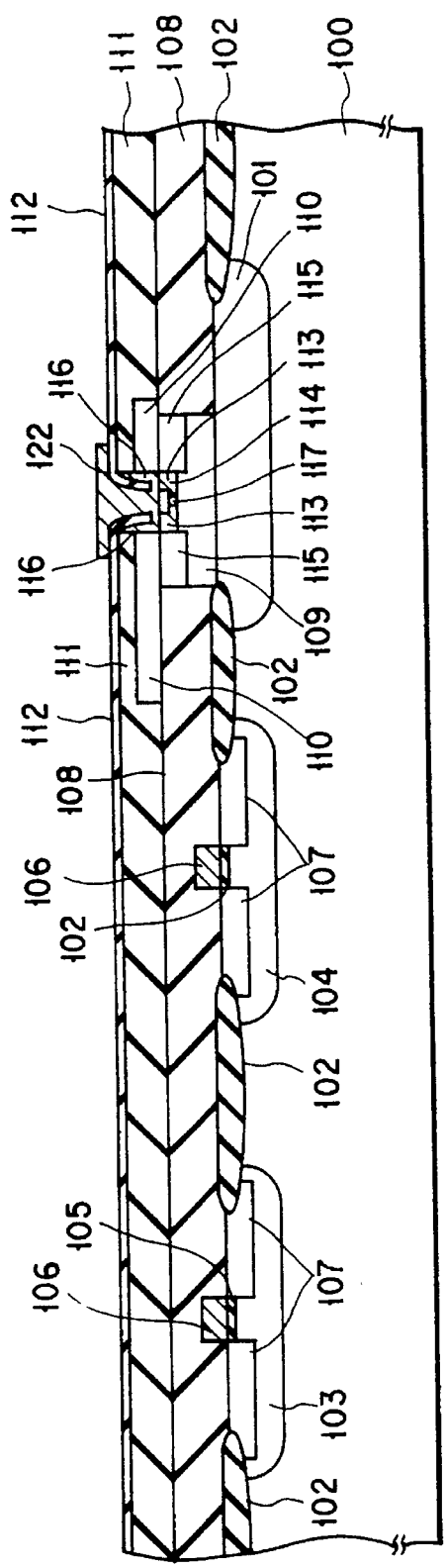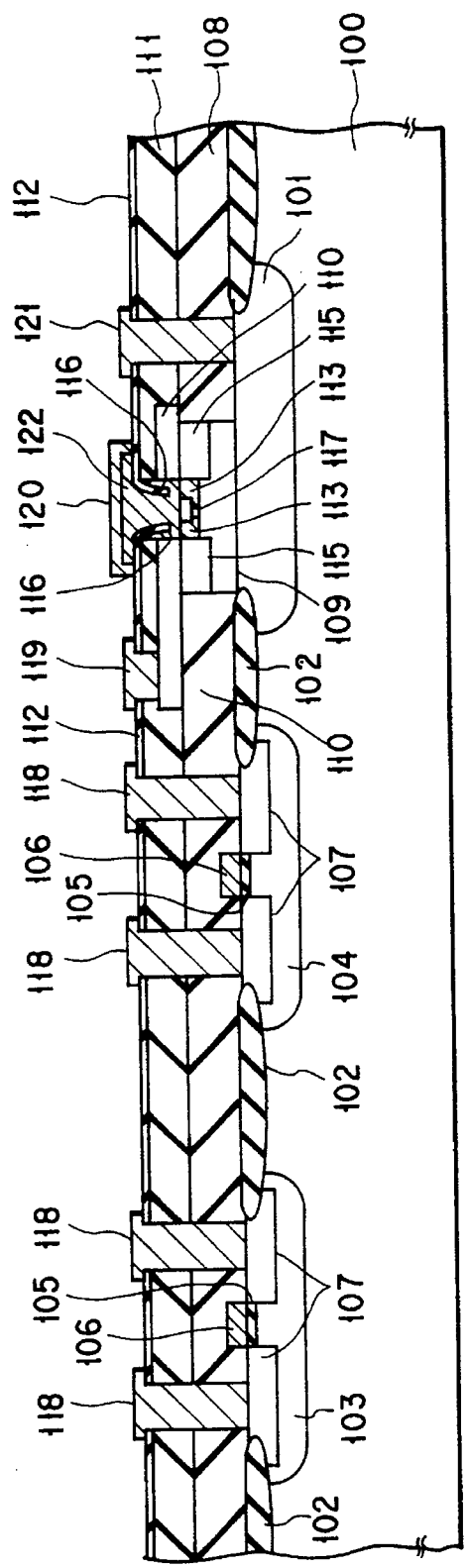
FIG. 2A
FIG. 2B

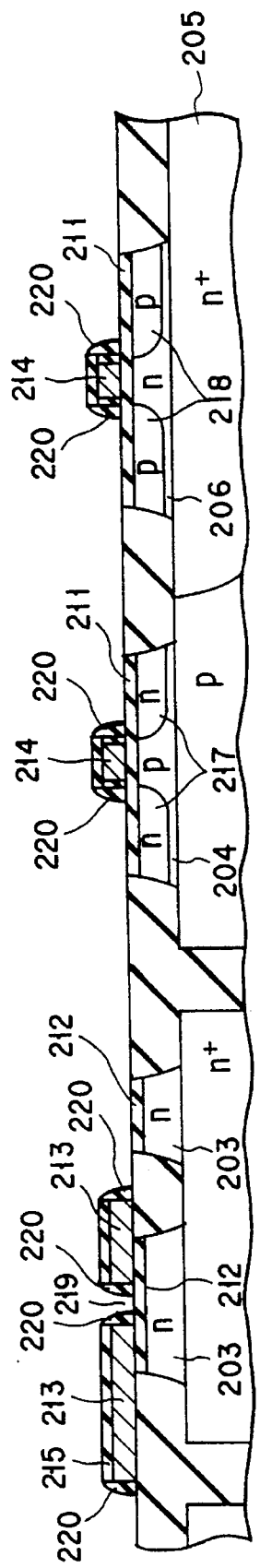
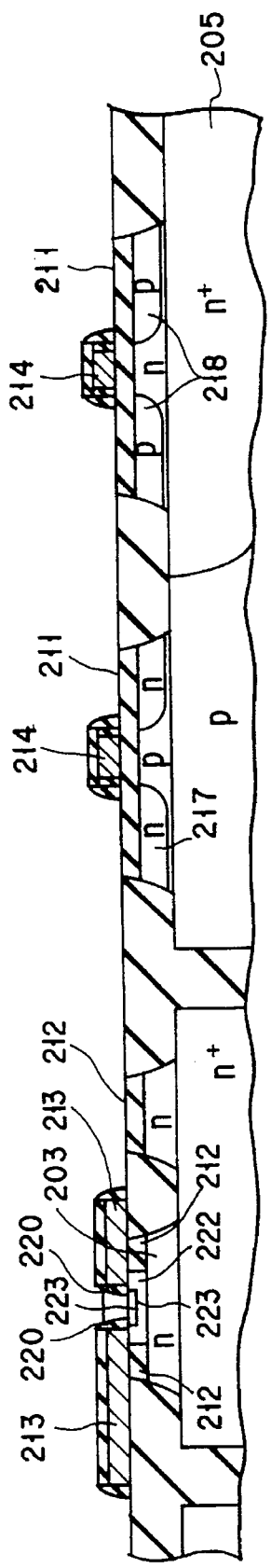
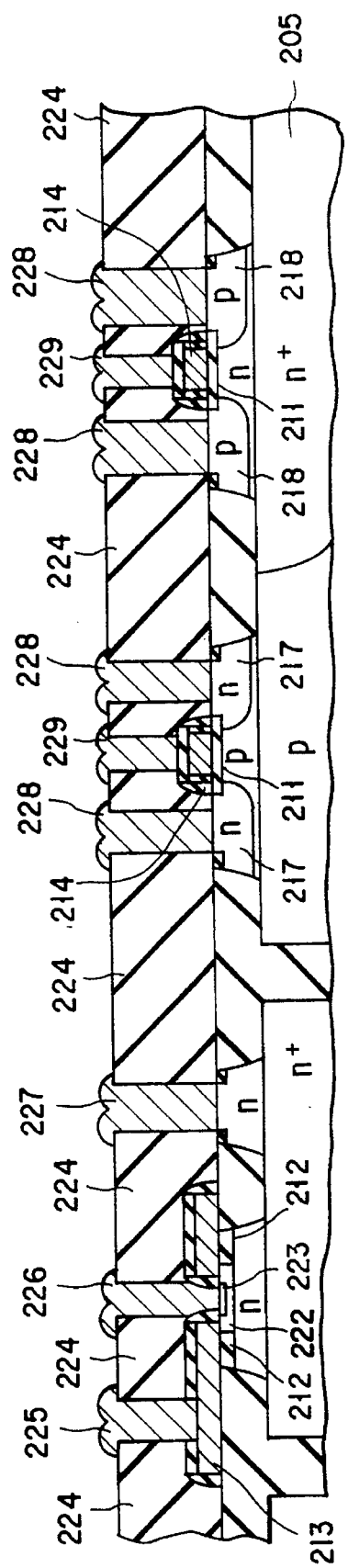
FIG. 5A
FIG. 5B
FIG. 5C 5,620,908

MANUFACTURING METHOD OF SEMICONDUCTOR DEVICE COMPRISING BICMOS TRANSISTOR

BACKGROUND OF THE INVENTION

1. Field of the Invention

This invention relates to a manufacturing method of a semiconductor device comprising a BiCMOS transistor.

2. Description of the Related Art

A principal portion of a recent electronic apparatus, such as a telecommunication device is mostly composed of a large scale integrated circuit (LSI) in which electric circuits constituted by a large number of transistors and resistors are integrated within a single chip.

Additionally, there is a strong demand for miniaturization of a telecommunication device, in particular a radio terminal device. Moreover, it is also urged recently to accelerate the operation speed of this kind of electronic device. Under these circumstances, a BiCMOS transistor which is a composite device comprising a CMOS transistor suited for high integration and a bipolar transistor suited for high speed operation has been noticed as being important for meeting these demands.

FIGS. 11A to 13C show cross-sectional views illustrating a manufacturing step of a high speed BiCMOS transistor according to a first embodiment of the conventional technique. Referring to FIG. 11A, an $n^+$-type diffusion layer 2 is formed on the surface of a p-type silicon substrate 1, and then an n-type epitaxial layer 3 is deposited all over the p-type silicon substrate 1.

Subsequently, a p-type well 4 and an n-type well 5 each extending down to the p-type silicon substrate 1 are selectively formed in the n-type epitaxial layer 3 as shown in FIG. 11B.

After a shallow trench insulating layer 6a is formed as shown in FIG. 11C, a deep trench insulating layer 7 is formed to isolate the $n^+$-type diffusion layer 2 from the p-type well 4 as well as from the n-type well 5. Then, the region of n-type epitaxial layer 3 to be formed into a bipolar transistor is partitioned by the formation of a shallow trench insulating layer 6b.

After forming a gate oxide layer 8 on the p-type well 4 as well as on the n-type well 5 as shown in FIG. 12A, an impurity is ion-implanted in the channel region 13 of the p-type well 4 as well as in the channel region 14 of the n-type well 5 so as to obtain a desired threshold voltage in each of these region.

Then, as shown in FIG. 12B, after a gate electrode 10 is formed on the gate oxide layer 8, an $n^+$-type diffusion layer 9 for forming a portion of collector, an $n^+$-type silicon layer 11 functioning as a collector-extracting electrode and a $p^+$-type silicon layer 12 functioning as a base-extracting electrode are formed respectively. Thereafter, an ion implantation is performed using the gate electrode 10 as a mask, thereby forming source/drain regions 15 and 16 on the surfaces of the p-type well 4 and the n-type well 5, respectively.

Further, the surface of the resultant substrate is deposited all over with a silicon oxide layer 17, on which a silicon nitride layer 18 is subsequently deposited as shown in FIG. 12C.

Then, an opening is formed by selectively etching the silicon nitride layer 18, the silicon oxide layer 17 and the $p^+$-type silicon layer 12, whereby exposing the surface of a region of the n-type epitaxial layer 3 in which an emitter and an inner base are to be formed in a subsequent step.

Subsequently, a silicon oxide layer 20 is formed on the bottom and side wall of the opening, and an impurity is ion-implanted through this silicon oxide layer 20 in the surface of the n-type epitaxial layer 3 to form an inner base region 21. Thereafter, a thermal treatment is performed to allow the n-type impurity contained in the $p^+$-type silicon layer 12 to diffuse into the n-type epitaxial layer 3, thus forming an outer base 19.

Then, after a silicon nitride layer for forming a side wall 22 is deposited all over the resultant substrate as shown in FIG. 13B, this silicon nitride layer is etched back to leave the side wall on the inner wall of the opening and at the same time to remove a portion of silicon oxide layer 20 disposed over a region for an emitter 24. After an $n^+$-type polycrystalline silicon layer for forming an emitter-extracting electrode 23 is deposited all over the resultant substrate, the n-type impurity in this $n^+$-type polycrystalline silicon layer is allowed to diffuse into the n-type epitaxial layer 3 to form an emitter 25. Then, the $n^+$-type polycrystalline silicon layer is patterned to form the emitter-extracting electrode 23.

Finally, the silicon nitride layer 18 and the silicon oxide layer 17 are etched away as shown in FIG. 13C to expose the upper surfaces of the source/drain regions 15 and 16, the base-extracting electrode 12 and the collector-extracting electrode 11. Then, the resultant substrate is deposited all over the surface thereof with a metallic layer, which is subsequently patterned forming a metallic wiring 24 (a source/drain electrode, a base electrode, a collector electrode and an emitter electrode), thus completing the basic structure of BiMOS transistor.

If LOCOS is employed as an element isolation in this case, a parasitic capacity is generated due to an interaction among the base-extracting electrode 12 (an upper capacitor electrode), a bird's beak-shaped insulating film (a capacitor insulating layer) and the outer base 19 (a lower capacitor electrode). In the example explained above however, the element isolation is effected by means of a trench isolation, so that a thin portion (bird's beak-shaped) as in the case of LOCOS would not be formed in the insulating layer for element isolation, thus making it possible to prevent the generation of the parasitic capacity. As explained above, it is possible according to the BiCMOS transistor making use of a trench isolating insulating layer to inhibit the generation of parasitic capacity, and therefore to fully realize a high speed performance of a bipolar transistor.

FIG. 14 shows, as an example of a second embodiment of the conventional technique, a cross-sectional view of the structure of a high speed BiCMOS transistor. This BiCMOS transistor can be manufactured as follows.

First, an $n^+$-type diffusion layer 32 is formed on the surface of a p-type silicon substrate 31, and then an n-type epitaxial layer 33 is deposited all over the p-type silicon substrate 31.

Subsequently, a trench isolating insulating layer 37 is formed for an element isolation after one region of the n-type epitaxial layer 33 for forming an n-type MOS transistor is converted into a p-type well 34 of predetermined impurity concentration, and another region of the n-type epitaxial layer 33 for forming an p-type MOS transistor is converted into an n-type well 34 of predetermined impurity concentration.

After the region for forming an npn-type bipolar transistor as well as the region for forming a p-type MOS transistor are covered with a protecting film (not shown), a p-type impurity ion implantation is performed so as to adjust the threshold voltage of the n-type channel region. Then, the protecting film covering the region for forming a p-type MOS transistor is removed, and the region for forming an n-type MOS transistor is covered with a protecting film (not shown). Then, an n-type impurity ion implantation is performed so as to adjust the threshold voltage of the p-type channel region. After removing the protecting film covering the region for forming an n-type MOS transistor, thus only the region for forming the npn-type bipolar transistor being covered with a protecting film, the whole surface of the resultant substrate is oxidized to form an oxide layer that is to become a gate oxide layer 40.

After a polycrystalline silicon layer 41 to be utilized as a gate electrode layer is deposited on the gate oxide layer 40, the polycrystalline silicon layer 41 which is an intrinsic semiconductor is turned into an $n^+$-type semiconductor by means of a phosphorus diffusion for example. After being deposited all over with a silicon layer 42, the $n^+$-type polycrystalline silicon layer 41 and the silicon oxide layer 42 are patterned, thus forming a gate electrode.

Then, a side wall 43 consisting for example of a silicon nitride layer is formed on the inner wall of the gate electrode. Subsequently, an n-type impurity such as As ion is implanted to form an $n^+$-type source/drain diffusion layer 44 of n-type MOS transistor, and at the same time, a p-type impurity such as B ion is implanted to form a $p^+$-type source/drain diffusion layer 45 of p-type MOS transistor, thus accomplishing a CMOS transistor.

Subsequently, a bipolar transistor is manufactured as follows. First of all, a protecting film covering the npn bipolar transistor is removed, and then only the region of CMOS is covered with a protecting film. A $p^+$-type polycrystalline silicon layer that is to become a base electrode-extracting electrode 46 is deposited all over and patterned in the form of a base electrode-extracting electrode. Thereafter, a silicon oxide layer 47 is deposited all over the surface of the resultant substrate.

Then, in order to minimize the collector resistance, an $n^+$-type diffusion layer (collector) 48 extending from the surface of the collector-extracting portion to the $n^+$-type buried layer 32 is formed. Next, the silicon oxide layer 47 and the $p^+$-type polycrystalline silicon layer 46 are etched away to expose the surface of an n-type epitaxial layer 33, thus forming an opening 49, through which a p-type impurity ion is implanted forming an inner base 50.

After depositing an insulating layer such as a silicon nitride layer all over the surface of the resultant substrate, an anisotropic etching of this insulating layer is performed to form a side wall 51. After a third polycrystalline silicon layer for forming an emitter-extracting electrode 52 is deposited, an n-type impurity such as arsenic ion is ion-implanted into this third polycrystalline silicon layer.

Then, the n-type impurity in the third polycrystalline silicon layer is diffused to form an emitter 53, and then the third polycrystalline silicon layer is patterned to form an emitter-extracting electrode 52. After an overall deposition of an insulating interlayer 54 is performed, a contact hole to each of the emitter, base, collector, source, gate and drain is respectively formed through the insulating interlayer 54.

Finally, an aluminum layer is deposited all over the surface of the resultant substrate, and then this aluminum layer is patterned to form electrodes for each of the emitter electrode 55, base electrode 56, collector electrode 57, source electrode 58, gate electrode 59 and drain electrode 60, thus completing a BiCMOS transistor.

However, there is a problem in the case of the first embodiment of the conventional technique that a leak current is more likely to be generated at the field edge portion of a MOS transistor. The cause of this leak current may be ascribed to a deterioration in adhesion between the shallow trench insulating layer 6a and the substrate as a result of the formation of a crystal defect in the substrate (a portion of the substrate which contacts with the shallow trench insulating layer 6a) during the step of forming the shallow trench insulating layer 6a. In the case of a bipolar transistor however, there would not be raised such a problem of leak current at the field edge portion, since there is disposed a deep trench insulating layer 7.

Moreover, in the case of a BiCMOS transistor according to the first embodiment of the conventional technique, there is another problem that the number of treatment step is increased, since it requires the formations of a deep trench insulating layer 7 and a shallow trench insulating layer 6b after the formation of a shallow trench insulating layer 6a. Namely, since the step of forming an element isolation layer of a MOS transistor is required to be performed in separate to the step of forming an element isolation layer of a bipolar transistor according to the first embodiment of the conventional technique, it is difficult to reduce the number of treatment step.

On the other hand, there is a problem also in the manufacturing method of a BiCMOS transistor according to the second embodiment of the conventional technique as explained below.

First, since a MOS transistor is required to be formed in separate to a bipolar transistor, the process for forming a BiCMOS transistor is complicated and takes a many number of steps. One of the reasons for forming a MOS transistor in separate to a bipolar transistor is a difference in structure between the MOS transistor and the bipolar transistor. Namely, a gate electrode is required to be contacted to a substrate through a gate oxide layer, whereas in the case of the base-extracting electrode and emitter-extracting electrode, they are required to be directly contacted to the substrate.

There is another problem that the profile of impurity concentration in the source/drain region or in the channel region which has been already formed may be altered as a result of a thermal treatment in the process of forming a bipolar transistor, thus causing the deterioration of the characteristic of semiconductor elements.

SUMMARY OF THE INVENTION

Accordingly, a first object of the present invention is to provide a method of manufacturing a semiconductor device which makes it possible to prevent the generation of a leak current at the field edge portion of a CMOS transistor.

A second object of this invention is to provide a method of manufacturing a semiconductor device which makes it possible to simplify and reduce the manufacturing steps of a semiconductor device.

In order to achieve the first object of the present invention, there is provided a method of manufacturing a semiconductor device, which comprises the steps of;

selectively oxidizing a surface of a substrate to form a region for a first conductive type MOS transistor and a region for a second conductive type MOS transistor of a CMOS transistor, and a region for a bipolar transistor, each region being isolated from one another by an oxide layer;

forming a second conductive type active region, a first active region of a first conductive type and a second active region of a first conductive type on a surface of the region for a first conductive type MOS transistor, a surface of the region for a second conductive type MOS transistor and a surface of the region for a bipolar transistor, respectively;

forming the first conductive type MOS transistor and the second conductive type MOS transistor in the second conductive type active region and the first active region of a first conductive type, respectively;

forming an insulating interlayer all over the surface of the substrate, and etching a portion of an insulating interlayer disposed over a region in which an emitter is to be formed, thereby forming an opening extending down to a surface of the second active region of a first conductive type;

forming a first semiconductor layer of a first conductive type that is to become a collector in the opening, and selectively forming a second conductive type semiconductor layer that is to become a base on a surface of the first semiconductor layer of a first conductive type; and forming a second semiconductor layer of a first conductive type that is to become an emitter on a surface of the second conductive type semiconductor layer.

In order to achieve the second object of the present invention, there is provided a method of manufacturing a semiconductor device, which comprises the steps of;

forming an element-isolating insulating layer on a surface of a semiconductor substrate whereby to form a second conductive type active region that is to become a first conductive type MOS transistor of a CMOS transistor and a first active region of a first conductive type that is to become a second conductive type MOS transistor of a CMOS transistor, and to form a second active region of a first conductive type that is to become a bipolar transistor;

forming a first insulating layer on each of surface of the second conductive type active region, a surface of the first active region of a first conductive type and a surface of the second active region of a first conductive type, and removing a portion of the first insulating layer that is disposed on the surfaces of the second conductive type active region and of the first active region of a first conductive type;

oxidizing the surfaces of the second conductive type active region and of the first active region of a first conductive type, thus forming a first oxide layer constituting a gate oxide layer, and then forming a conductive layer all over the surface of the semiconductor substrate;

forming a gate electrode of the first conductive type MOS transistor, a gate electrode of the second conductive type MOS transistor and a base-extracting electrode of the bipolar transistor by patterning the conductive layer;

forming an opening extending to a surface of the first insulating layer by etching a portion of the base-extracting electrode disposed over a region that is to become an emitter, and then forming a side wall insulating layer on an inner wall of the opening;

removing not only all of the first insulating layer disposed on a bottom of the opening but also part of the first insulating layer disposed around the bottom of opening, thereby forming an overhung portion underneath the base-extracting electrode;

epitaxially growing a second conductive type semiconductor layer that is to become a base by making use of the base-extracting electrode exposed at the overhung portion as well as making use of the second active region of a first conductive type exposed to the opening as a seed crystal to such an extent as to bury the overhung portion; and selectively forming a first conductive type semiconductor layer that is to become an emitter on a surface of the second conductive type semiconductor layer in such a manner as to avoid the first conductive type semiconductor layer from being contacted with the base-extracting electrode.

In order to achieve the second object of the present invention, there is further provided a method of manufacturing a semiconductor device, which comprises the steps of;

forming an element-isolating insulating layer on a surface of a semiconductor substrate whereby to form a second conductive type active region that is to become a first conductive type MOS transistor of a CMOS transistor and a first active region of a first conductive type that is to become a second conductive type MOS transistor of a CMOS transistor, and to form a second active region of a first conductive type that is to become a bipolar transistor;

forming a first oxide layer on a surface of the second conductive type active region, a surface of the first active region of a first conductive type and a surface of the second active region of a first conductive type by oxidizing these surfaces, and removing a portion of the first oxide layer that is disposed on the surfaces of the second conductive type active region and of the first active region of a first conductive type;

oxidizing the surfaces of the second conductive type active region, the first active region of a first conductive type and the second active region of a first conductive type, thus forming a second oxide layer constituting a gate oxide layer, and then forming a conductive layer all over the surface of the semiconductor substrate;

forming a gate electrode of the second conductive type MOS transistor, a gate electrode of the first conductive type MOS transistor and a base-extracting electrode by patterning the conductive layer;

forming a first insulating layer all over the surface of the semiconductor substrate, and then forming an opening extending to a surface of the second oxide layer by etching parts of the base-extracting electrode and the first insulating layer disposed over a region that is to become an emitter;

removing part of the base-extracting electrode which is formed on a wall of the opening, thereby forming a first overhung portion underneath the first insulating layer;

removing, by way of wet-etching, not only all of the first oxide layer and second oxide layer disposed on a bottom of the opening but also part of the first oxide layer and the second oxide layer disposed around the bottom of opening, thereby forming a second overhung portion underneath the base-extracting electrode;

epitaxially growing a second conductive type semiconductor layer that is to become a base by making use of the base-extracting electrode exposed at the first and second overhung portions and as well as making use of the second active region of a first conductive type exposed to the second overhung portion and the opening as a seed crystal to such an extent as to bury the second overhung portion;

forming a second insulating layer all over the surface of the semiconductor substrate, and then wet-etching the second insulating layer in such a manner as to leave the second insulating layer only in the first overhung portion; and forming a second conductive layer containing a first conductive type impurity all over the surface of the semiconductor substrate, and then diffusing the first conductive type impurity into the surface of the second conductive type semiconductor layer by way of a thermal treatment thereby forming the emitter.

In order to achieve the second object of the present invention, there is additionally provided a method of manufacturing a semiconductor device, which comprises the steps of;

selectively forming a first insulating layer on a prospected element-forming region of a semiconductor substrate;

anisotropically etching the semiconductor substrate with the first insulating layer being used as a mask, thereby forming a shallow groove in a region other than the element-forming region;

depositing a second insulating layer so as to bury the shallow groove with the second insulating layer;

forming a second conductive type active region, a first active region of a first conductive type and a second active region of a first conductive type on a surface of a region for forming a first conductive type MOS transistor of CMOS transistor, a surface of a region for forming a second conductive type MOS transistor of CMOS transistor and a surface of a region for forming a bipolar transistor, respectively;

removing a portion of the first insulating layer that is disposed on the surfaces of the second conductive type active region and of the first active region of a first conductive type;

oxidizing the surfaces of the second conductive type active region and of the first active region of a first conductive type, thus forming a first oxide layer constituting a gate oxide layer, and then forming a conductive layer all over the surface of the semiconductor substrate;

forming a gate electrode of the first conductive type MOS transistor, a gate electrode of the second conductive type MOS transistor and a base-extracting electrode of the bipolar transistor by patterning the conductive layer;

forming an opening extending to a surface of the first insulating layer by etching a portion of the base-extracting electrode disposed over a region that is to become an emitter, and then forming a side wall insulating layer on an inner wall of the opening;

removing not only all of the first insulating layer disposed on a bottom of the opening but also part of the first insulating layer disposed around the bottom of opening, thereby forming an overhung portion underneath the base-extracting electrode;

epitaxially growing a second conductive type semiconductor layer that is to become a base by making use of the base-extracting electrode exposed at the overhung portion as well as making use of the second active region of a first conductive type exposed to the opening as a seed crystal to such an extent as to bury the overhung portion; and selectively forming a first conductive type semiconductor layer that is to become an emitter on a surface of the second conductive type semiconductor layer in such a manner as to avoid the surface of the first conductive type semiconductor layer from being contacted with the base-extracting electrode.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 1A, 1B and 1C show cross-sectional views illustrating the first half manufacturing steps of a BiCMOS according to a first example of this invention;

FIGS. 2A and 2B show cross-sectional views illustrating the latter half manufacturing steps of a BiCMOS according to a first example of this invention;

FIGS. 5A, 5B and 5C show cross-sectional views illustrating the latter half manufacturing steps of a BiCMOS according to a second example of this invention;

DETAILED DESCRIPTION OF THE PREFERRED EMBODIMENTS

Figure 3A:
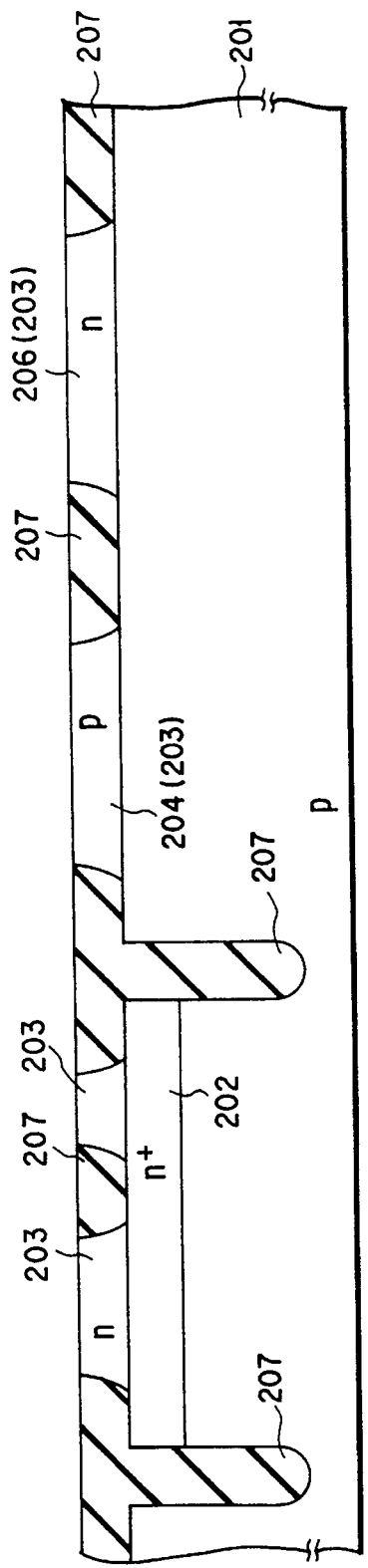
FIGS. 3A, 3B and 3C show cross-sectional views illustrating the first half manufacturing steps of a BiCMOS according to a second example of this invention.

In the followings, this invention will be explained with reference to the drawings.

FIGS. 1A, 1B, 1C, and FIGS. 2A, 2B show cross-sectional views illustrating the manufacturing steps of a BiCMOS according to a first example of this invention.

First, referring to FIG. 1A, a monocrystal p-type silicon substrate 100 containing a p-type impurity such as boron is prepared. Then, a plurality of silicon oxide layers 102 are selectively formed on the surface of this substrate 100. Subsequently, a p-type impurity and an n-type impurity are diffused through surface portions of the p-type silicon substrate 100 which are not covered with the silicon oxide layers 102, thus forming a p-type well 103 (a second conductive type active region), an n-type well 104 (a first active region of a first conductive type) and an $n^+$-type buried layer 101 (a second active region of a first conductive type).

Then, as shown in FIG. 1B, an insulating layer (for example, a silicon oxide layer) that is to become a gate oxide layer 105, and a conductive layer (for example, a polycrystalline silicon layer containing an impurity) that is to become a gate electrode 106 are successively formed all over the resultant substrate, and then patterned. Thereafter, a source/drain region 107 is formed by making use of the gate electrode 106 as a mask.

After depositing an insulating interlayer 108 all over the surface of the resultant substrate, part of this insulating interlayer 108 is etched off to form an opening over the n$^+$-type buried layer 101 as shown in FIG. 1C. Thereafter, a monocrystal n-type silicon layer 109 (a first semiconductor layer of a first conductive type) is allowed to epitaxially grow by making use of the monocrystal p-type silicon substrate 100 as a seed crystal, which is exposed at the bottom of the opening.

After a p$^+$-type polycrystalline silicon layer that is to become a base-extracting electrode 110 is deposited all over the surface of the resultant substrate as shown in FIG. 2A, this p$^+$-type polycrystalline silicon layer is patterned into a predetermined shape. Subsequently, a silicon oxide layer 111 and a silicon nitride layer 112 are successively deposited all over the surface of the resultant substrate, and then these silicon nitride layer 112, silicon oxide layer 111 and polycrystalline silicon layer are partially etched away to form an opening, thereby exposing the surface of the n-type epitaxial layer 109 in which an emitter and an inner base are to be formed. At the same time, the base-extracting electrode 110 is formed.

Then, a silicon oxide layer 113 is formed on the bottom and on the lower side wall of the opening, and then a p-type impurity ion implantation is performed in the surface of the n-type epitaxial layer 109 through this silicon oxide layer 113 to form an inner base 114 (a second conductive type semiconductor layer). Then, a thermal treatment is performed to diffuse the p-type impurity contained in the base-extracting electrode 110 (p$^+$-type polycrystalline silicon layer) into the n-type epitaxial layer 109 to form an outer base 115. After a silicon nitride layer that is to become a side wall 116 is deposited all over the surface of the substrate, an etch-back treatment of this silicon nitride layer is performed to form the side wall 116 on the side wall of the opening and at the same time to remove part of the silicon oxide layer 113 disposed over a region for forming an emitter.

An n$^+$-type polycrystalline silicon layer that is to become an emitter-extracting electrode 122 is then deposited all over the substrate and thermally treated to diffuse an n-type impurity contained in this n$^+$-type polycrystalline silicon layer into the n-type epitaxial layer 109 to form an emitter 117 (a second semiconductor layer of a first conductive type). Thereafter, the n$^+$-type polycrystalline silicon layer is patterned to form the emitter-extracting electrode 122.

Finally, the silicon nitride layer 112 and silicon oxide layer 111 are etched away to form contact holes for each of the source/drain region 107, the base-extracting electrode 110 and the n$^+$-type buried layer (a collector region) 101, and then a conductive layer such as an Al layer is deposited all over the surface of the substrate as shown in FIG. 2B. This conductive layer is then patterned to form a source/drain electrode 118, a base electrode 119, an emitter electrode 120 and a collector electrode 121, thus accomplishing the basic structure of a BiCMOS transistor.

According to this first example, since the insulating film for element isolation (the silicon oxide layer 102) in a MOS transistor and bipolar transistor is formed by a selective oxidation, it is possible to prevent the generation of a crystal defect, i.e. a problem peculiar to the case when a trench isolating insulating layer is used. Therefore, the adhesion between an element isolating insulating layer and a semiconductor layer (for example, p-type well 103 and source/drain region 107) can be improved, thus making it possible to prevent the generation of a leak current at the field edge portion.

Moreover, since a MOS transistor is isolated not only via a silicon oxide layer 102, but also via an insulating interlayer 108, it is possible to obtain the same effect as that when a deep trench isolating insulating layer is employed.

Furthermore, since the steps for forming the silicon oxide layer 102 and the insulating interlayer 108, both functioning as an element isolating insulating layer, can be performed simultaneously in the process of forming both of a MOS transistor and a bipolar transistor, the step of forming an element isolating insulating layer can be simplified as compared with the conventional method of forming an element isolating insulating layer.

FIGS. 3A to 5C show cross-sectional views illustrating the manufacturing steps of a BiCMOS according to a second example of this invention.

First, referring to FIG. 3A, an n$^+$-type buried layer 202 is selectively formed on the surface of a p-type semiconductor substrate 201, and then an n-type epitaxial layer 203 is deposited all over the resultant substrate.

Subsequently, one region of this n-type epitaxial layer 203 that is to become an n-type MOS transistor is converted into a p-type well 204 having a predetermined impurity concentration and at the same time another region of this n-type epitaxial layer 203 that is to become a p-type MOS transistor is converted into an n-type well 206 having a predetermined impurity concentration. Then, a trench isolating insulating layer 207 (an element isolating insulating layer) for effecting an element isolation is formed.

Figure 3B:
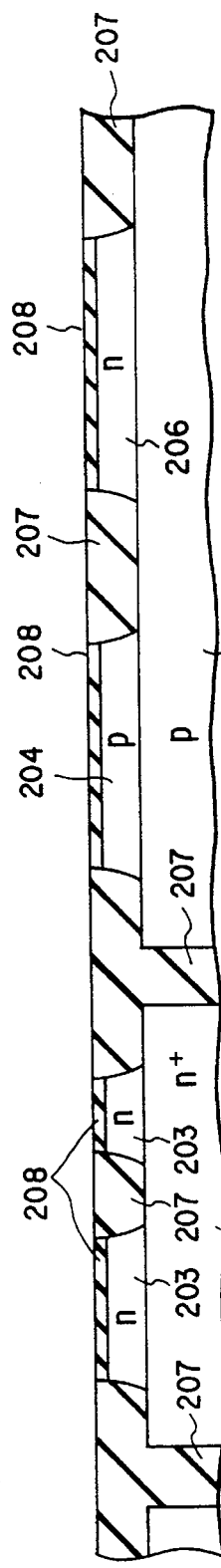

After forming a silicon oxide layer 208 (a first oxide layer) by oxidizing the whole surface of the resultant substrate as shown in FIG. 3B, a region for forming an npn-type bipolar transistor and a region for forming a p-type MOS transistor are covered with a protecting layer (not shown). Then, an ion implantation with an n-type impurity (for example, phosphorus or arsenic) is performed thereby to adjust the threshold voltage of the p-channel region.

Figure 3C:
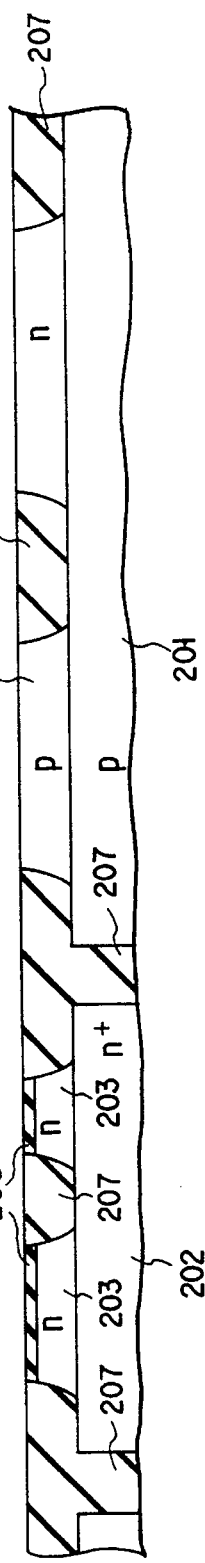
Figure 4A:
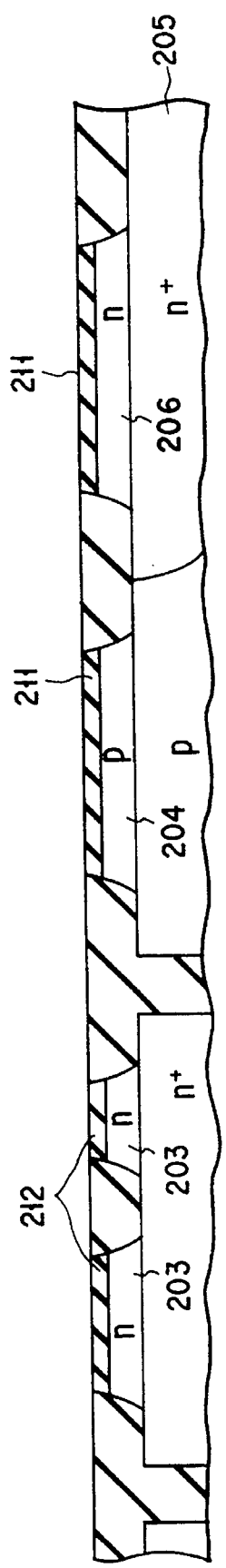
FIGS. 4A, 4B and 4C show cross-sectional views illustrating the intermediate manufacturing steps of a BiCMOS according to a second example of this invention.

Then, after the silicon oxide layer 208 of a CMOS transistor portion is selectively removed as shown in FIG. 3C, the whole surface of the resultant substrate is re-oxidized to form a gate oxide layer 211 (a second oxide layer) having a predetermined thickness as shown in FIG. 4A.

The silicon oxide layer 212 of the bipolar transistor portion has a thickness which is equal to a total of the thickness of the silicon oxide layer 208 and the thickness of the gate oxide layer 211. However, the thickness of the silicon oxide layer 212 is adjusted in this case to become twice as thick as that of a base layer 222.

Figure 4B:
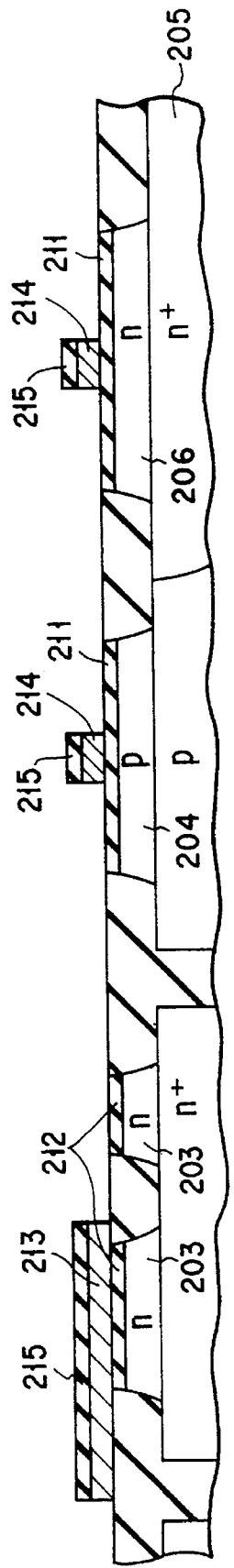

Thereafter, a first polycrystalline silicon layer that is to become a base-extracting electrode 213 and a gate electrode 214 is deposited all over the surface of the resulted substrate as shown in FIG. 4B. Then, a p-type impurity (for example, boron) is selectively ion-implanted into part of the first polycrystalline silicon layer disposed over the prospected region for forming a bipolar transistor, thereby making it into a p-type region. On the other hand, an n-type impurity (for example, phosphorus or arsenic) is selectively ion-implanted into another part of the first polycrystalline silicon layer disposed over the prospected region for forming a CMOS transistor, thereby turning it into an n-type region. These selective ion implantation can be performed by making use of a lithography, i.e. by forming a mask pattern on the regions where ions are not to be implanted.

A silicon nitride layer 215 is then deposited on the entire surface of the resultant substrate. Thereafter, this silicon nitride layer 215 and the first polycrystalline silicon (a conductive layer) are patterned to form a base-extracting electrode 213 and a gate electrode 214, respectively.

Figure 4C:
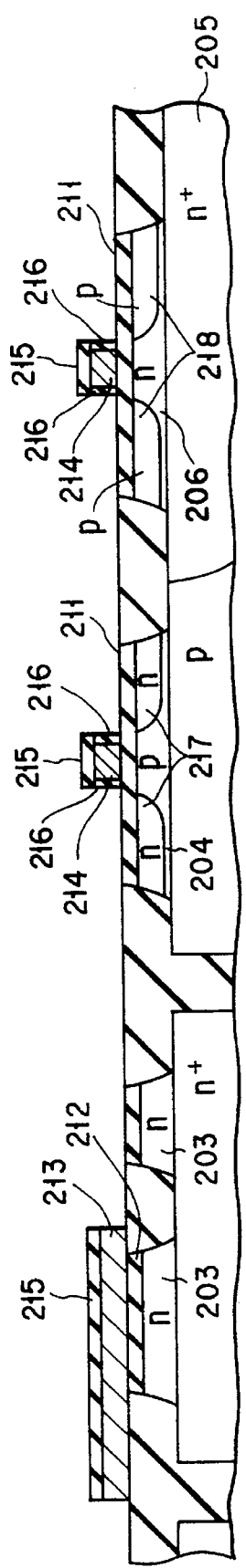

The side wall of the gate electrode (a polycrystalline silicon layer) 214 is then oxidized, forming a gate side wall insulating layer (silicon oxide layer) 216 as shown in FIG. 4C. Then, an n-type impurity (for example, phosphorus) is ion-implanted into the n-type MOS transistor portion to form an n-type source/drain region 217, while a p-type impurity (for example, boron) is ion-implanted into the p-type MOS transistor portion to form a p-type source/drain region 218.

Then, as shown in FIG. 5A, parts of the base-extracting electrode 213 and of the silicon nitride layer 215 disposed over a region for forming an emitter are etched away to form an opening 219. After depositing an insulating layer (for example, a nitride layer) on the surface of the resultant substrate, this insulating layer is subjected to anisotropic etching to form a side wall 220 (a sidewall insulating layer).

Subsequently, not only all of the silicon oxide layer 212 disposed at the bottom of the opening, but also part of the silicon oxide layer 212 disposed around the bottom of opening are removed by way of a wet etching, thereby forming an overhung portion underneath the base-extracting electrode 213. As a result, the surfaces of the n-type epitaxial layer 203 and of the base-extracting electrode 213 disposed over a region that is to become a base are exposed.

Then, an epitaxial semiconductor layer that is to become a p-type base 222 (a second conductive type semiconductor layer) is selectively grown, and an n-type emitter 223 (a first conductive semiconductor layer) is successively grown. Specifically, a gas containing diborane ($B_2H_6$) is employed under a predetermined pressure, temperature and flow rate to initiate an epitaxial growth of the base 222, and when the thickness of the base 222 is increased to a predetermined thickness, the diborane is substituted by arsine ($AsH_3$), thus continuing the epitaxial growth with the pressure, temperature and gas flow rate being readjusted thereby accomplishing the formation of the emitter 223.

If monogermane ($GeH_4$) is added to the reactive gas under a predetermined pressure, temperature and flow rate in the growth of the base 222, a base 222 comprising SiGe may be obtained. In this case, the epitaxial semiconductor layer that is to become the base 222 is composed of two different parts, i.e. a first epitaxial semiconductor layer growing from the n-type epitaxial layer 203 and a second epitaxial semiconductor layer growing from the base-extracting electrode 213. Since the growth rate of the first epitaxial semiconductor layer is substantially the same as that of the second epitaxial semiconductor layer, the thickness of the first epitaxial semiconductor layer becomes about a half of the thickness of the silicon oxide layer 212.

Finally, an insulating interlayer 224 is deposited all over the surface of the resultant substrate, and contact holes are formed at predetermined locations as shown in FIG. 5C. Subsequently, a conductive layer is deposited all over the surface of the resultant substrate and then patterned to form a base electrode 225, an emitter electrode 226, a collector electrode 227, a source/drain electrode 228 and an upper electrode 229, thus accomplishing the basic structure of a BiCMOS transistor.

According to the second example as explained above, the formation of a gate oxide layer is proceeded while leaving a silicon oxide layer 212 formed in a bipolar transistor portion. Namely, the process of forming a bipolar transistor can be proceeded in simultaneous with the formation of a MOS transistor, wherein the silicon oxide layer 212 is wet-etched in an intermediate step of FIG. 5B to form an over-hung portion exposing the surfaces of an n-type epitaxial layer 203 and a base-extracting electrode 213, and then, an epitaxial growth is effected using these exposed portions as a seed crystal, thereby forming the base 222 and emitter 223.

As explained above, it is possible according to the method of the second example of this invention to avoid the manufacturing process from becoming complicated or increased in number of manufacturing steps, since the manufacturing process of a MOS transistor can be performed in simultaneous with that of a bipolar transistor in contrast to the conventional method wherein these transistors are separately fabricated.

Moreover, since the base 222 and emitter 223 are formed through an epitaxial growth which is a low temperature process, the problem of impurity concentration profile fluctuation in the source/drain region or channel region of a MOS transistor during the formation of the base 222 and emitter 223 can never be occurred. Therefore, it is possible to obtain a semiconductor element exhibiting an excellent performance.

FIGS. 6A to 6J show cross-sectional views illustrating the manufacturing steps of a main portion (an emitter and a base) of a BiCMOS according to a third example of this invention.

Figure 6A:
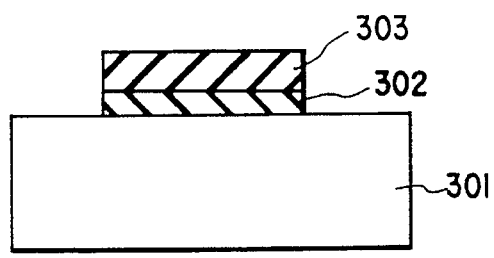
FIGS. 6A to 6J are show cross-sectional views illustrating a process for forming a main portion (emitter and base) of a bipolar transistor according to a third example of this invention.

First, referring to FIG. 6A, a silicon nitride layer 302 and a first silicon oxide layer 303 are successively formed on an n-type silicon substrate 301. Then, a photoresist pattern is formed over this first silicon oxide layer 303. This photoresist pattern is used as a mask to anisotropically etching the first silicon oxide layer 303 and the silicon nitride layer 302 into predetermined shapes. Thereafter, the photoresist pattern is removed.

Figure 6B:
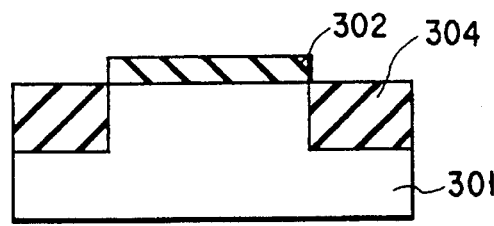

Then, the n-type silicon substrate 301 is etched using the first silicon oxide layer 303 as a mask to form a shallow trench as shown in FIG. 6B. Subsequently, after removing the first silicon oxide layer 303, a second silicon oxide layer 304 for forming a field oxide layer is deposited all over the resultant substrate. In this case, the second silicon oxide layer 304 is formed thick enough to cause the surface thereof to become flat.

Then, the etch-back of the second silicon oxide layer 304 is performed so as to have the shallow trench buried with the second silicon oxide layer 304. The level of the second silicon oxide layer 304 is made flush with the surface of the element region of substrate in this FIG. 6B. However, the level of the second silicon oxide layer 304 may be slightly higher than the surface of the element region of substrate. Namely, the etch-back may be terminated when the surface of the silicon nitride 302 is exposed.

When the etch-back is terminated at such a moment, it is possible to reliably prevent an over-etching of the second silicon oxide layer (a field oxide layer) 304 within the shallow trench thereby to achieve a reliable element isolation. In other words, it is possible to secure the thickness of the silicon nitride as a margin of etch-back. Additionally, if the over-etching of the field oxide layer 304 can be prevented, or in other words, if a sufficient thickness of the field oxide layer 304 can be assured, the parasitic capacity can be minimized thus making it possible to achieve an ultra-high speed operation.

Figure 6C:
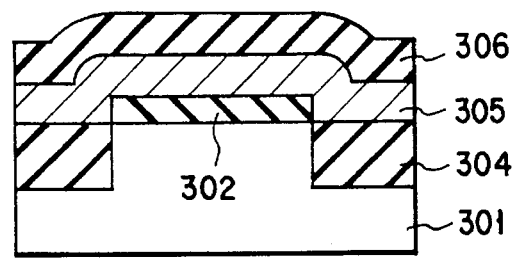

Then, a first polycrystalline silicon layer 305 that is to become a base-extracting electrode is deposited all over the resultant substrate as shown in FIG. 6C, and a p-type impurity (for example, boron) is ion-implanted into the first polycrystalline silicon layer 305 to turn it into a p-type layer. Thereafter, a third silicon oxide layer 306 is deposited on the first polycrystalline silicon layer 305.

Figure 6D:
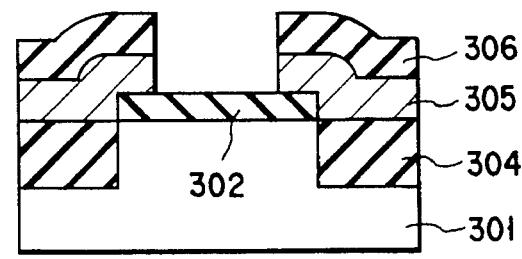

As shown in FIG. 6D, parts of the first polycrystalline silicon layer 305 and the third silicon oxide layer 306 disposed over a region that is to become an emitter are selectively removed through an anisotropic etching to form an opening, and at the same time to form a base-extracting electrode.

Figure 6E:
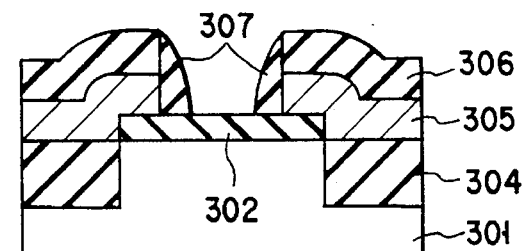

Then, as shown in FIG. 6E, a fourth silicon oxide layer that is to become a side wall 307 is deposited all over the resultant substrate, and then the entire surface is etch-backed thus selectively leaving the fourth silicon oxide layer on the side wall of the opening thereby to form a side wall 307.

Figure 6F:
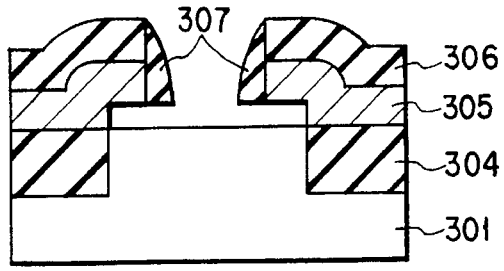

The silicon nitride layer 302 is then etched away by way of isotropic etching (for example, a wet etching or CDE) thereby forming an over-hung portion as shown in FIG. 6F.

Figure 6G:
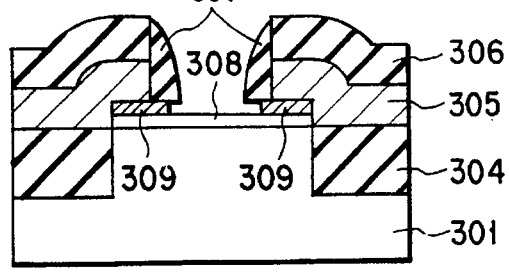
Figure 6H:
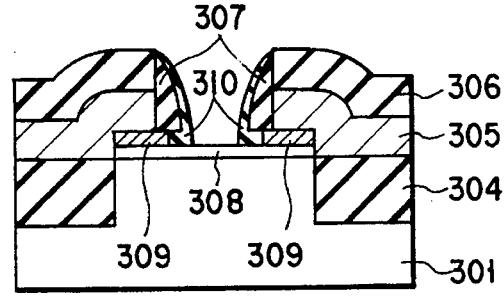

As shown in FIG. 6G, a selective epitaxial growth of a boron-doped silicon is performed by utilizing as a seed crystal a portion of the n-type silicon substrate 301 which is exposed to the over-hung portion and the opening, thereby forming a base 308. In this case, a polycrystalline silicon layer 309 is also grown from a portion of the first polycrystalline silicon layer 305 exposed at the over-hung portion so as to cause the base 308 to contact, through this polycrystalline silicon layer 309, with the first polycrystalline silicon layer 305.

Subsequently, a fifth silicon oxide layer 310 is deposited all over the surface of the resultant substrate, and then the resultant entire surface is etch-backed to such an extent as to leave the fifth silicon oxide layer 310 only on the over-hung portion and the side wall 307.

Figure 6I:
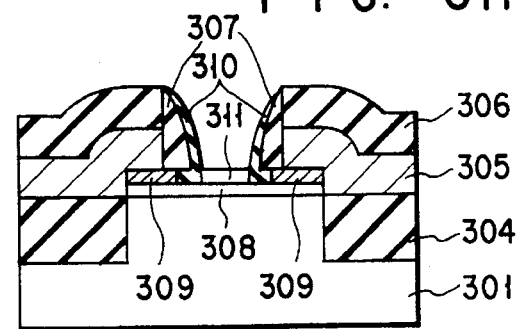

As shown in FIG. 6I, a selective epitaxial growth of a arsenic-doped silicon for forming an emitter 311 is then performed by utilizing as a seed crystal a silicon layer constituting the base 308 disposed within the opening.

Figure 6J:
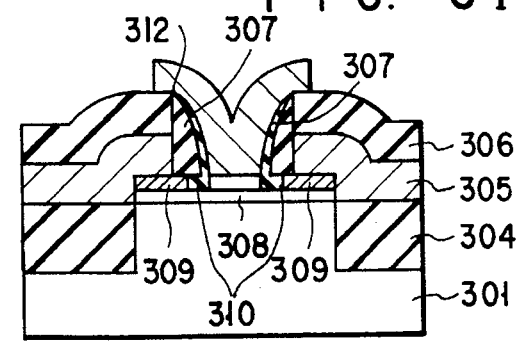

Finally, after depositing a second polycrystalline silicon layer that is to become an emitter-extracting electrode 312 all over the resultant substrate as shown in FIG. 6J, this second polycrystalline silicon layer is patterned to form the emitter-extracting electrode 312, thus finishing the main manufacturing step for forming the main portion of the device.

Since an epitaxial growth is employed for the formation of the base 308 in this example, it is possible to sufficiently minimize the thickness of the base 308 as compared with the conventional method utilizing an ion implantation or diffusion, thereby making it possible to further improve the high speed operation of a bipolar transistor.

Moreover, since the over-etching of the field oxide layer 304 can be prevented, it possible to further improve the high speed operation of a bipolar transistor.

FIGS. 7A to 7J show cross-sectional views illustrating the manufacturing steps of a main portion (an emitter and a base) of a BiCMOS according to a fourth example of this invention.

Figure 7A:
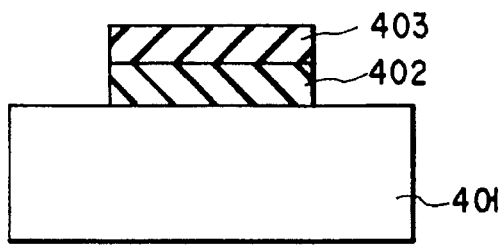
FIGS. 7A to 7I are show cross-sectional views illustrating a process for forming a main portion (emitter and base) of a bipolar transistor according to a fourth example of this invention.

First, referring to FIG. 7A, a silicon nitride layer 402 and a first silicon oxide layer 403 are successively formed on an n-type silicon substrate 401. Then, a photoresist pattern is formed over this first silicon oxide layer 403. This photoresist pattern is used as a mask to anisotropically etching the first silicon oxide layer 403 and the silicon nitride layer 402 into predetermined shapes. Thereafter, the photoresist pattern is removed.

Figure 7B:
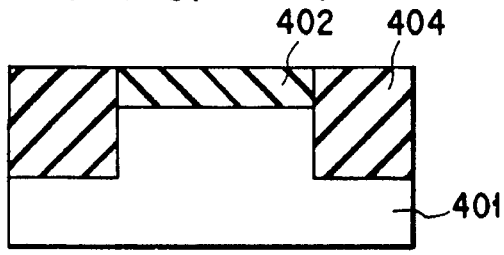

Then, the n-type silicon substrate 401 is etched using the first silicon oxide layer 403 as a mask to form a trench as shown in FIG. 7B. Subsequently, after removing the first silicon oxide layer 403, a second silicon oxide layer 404 for forming a field oxide layer is deposited all over the resultant substrate. In this case, the second silicon oxide layer 404 is formed thick enough to cause the surface thereof to become flat.

Then, the etch-back of the second silicon oxide layer 404 is performed until the surface of the silicon nitride layer 402 is exposed so as to have the trench buried with the second silicon oxide layer 404. In this case, the level of the second silicon oxide layer 404 may be slightly lower than that of silicon nitride layer 402. Namely, the etch-back may be terminated after the surface of the silicon nitride 402 is exposed and before the surface of the second silicon oxide layer 404 is lowered down to the surface of the n-type silicon substrate 401 of the element region.

When the etch-back is terminated at such a moment, it is possible to reliably prevent an over-etching of the second silicon oxide layer 404 within the trench thereby to achieve a reliable element isolation. In other words, it is possible to secure the thickness of the silicon nitride 402 as a margin of etch-back.

Figure 7C:
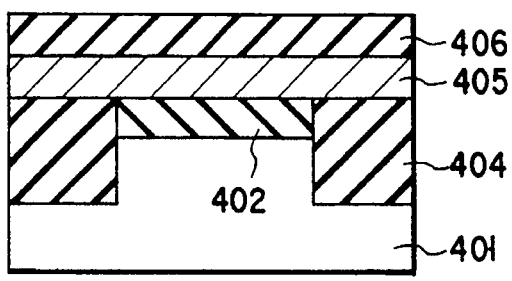

Then, a first polycrystalline silicon layer 405 that is to become a base-extracting electrode is deposited all over the resultant substrate as shown in FIG. 7C, and a p-type impurity (for example, boron) is ion-implanted into the first polycrystalline silicon layer 405 to turn it into a p-type layer. Thereafter, a third silicon oxide layer 406 is deposited on the first polycrystalline silicon layer 405.

Figure 7D:
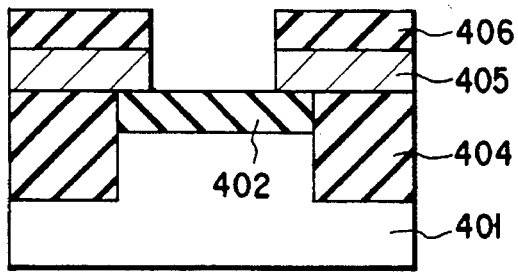

As shown in FIG. 7D, parts of the first polycrystalline silicon layer 405 and the third silicon oxide layer 406 disposed over a region that is to become an emitter are selectively removed through an anisotropic etching to form an opening, and at the same time to form a base-extracting electrode.

Figure 7E:
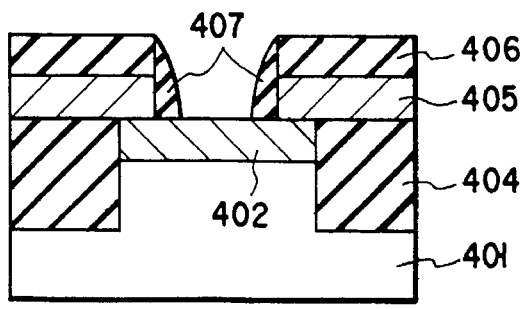

Then, as shown in FIG. 7E, a fourth silicon oxide layer that is to become a side wall 407 is deposited all over the resultant substrate, and then the entire surface is etch-backed thus selectively leaving the fourth silicon oxide layer on the side wall of the opening thereby to form a side wall 407.

Figure 7F:
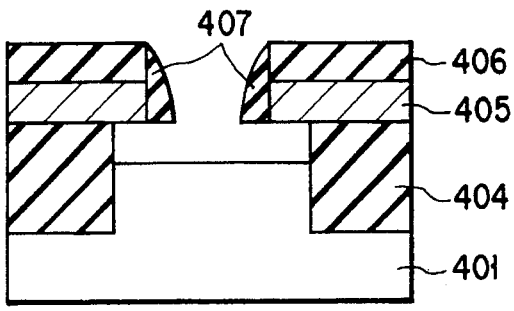

The silicon nitride layer 402 is then etched away by way of isotropic etching (for example, a wet etching or CDE) thereby forming an over-hung portion as shown in FIG. 7F.

Figure 7G:
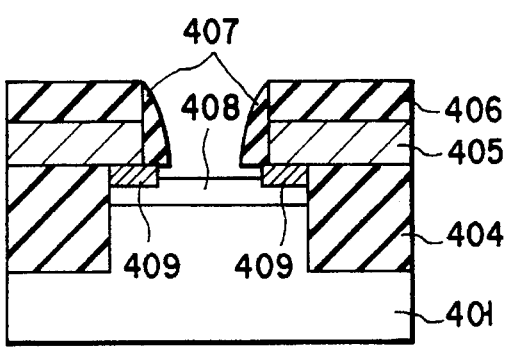
Figure 7H:
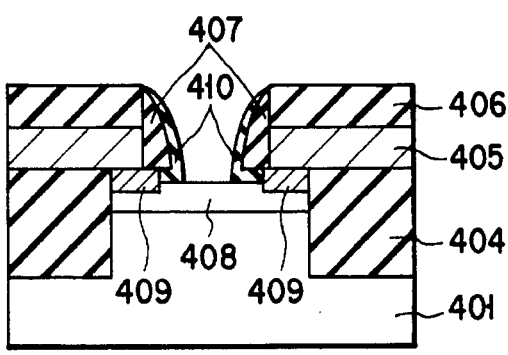

As shown in FIG. 7G, a selective epitaxial growth of a boron-doped silicon is performed by utilizing as a seed crystal a portion of the n-type silicon substrate 401 which is exposed to the over-hung portion and the opening, thereby forming a base 408. In this case, a polycrystalline silicon layer 409 is also grown from a portion of the first polycrystalline silicon layer 405 exposed at the over-hung so as to cause the base 408 to contact, through this polycrystalline silicon layer 409, with the first polycrystalline silicon layer 405.

Subsequently, a fifth silicon oxide layer is deposited all over the surface of the resultant substrate, and then the resultant entire surface is etch-backed to such an extent as to leave the fifth silicon oxide layer 410 only on the over-hung portion and the side wall 407.

Figure 7I:
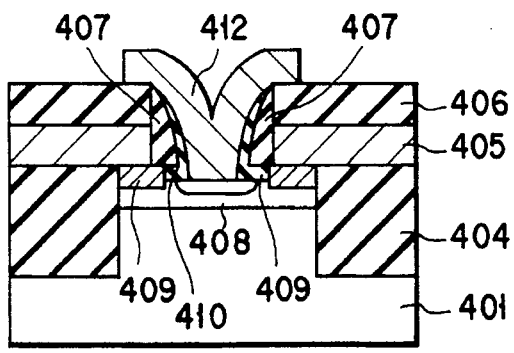

Finally, after depositing a second polycrystalline silicon layer doped with arsenic that is to become an emitter-extracting electrode 412 all over the resultant substrate as shown in FIG. 7I, the arsenic contained in this second polycrystalline silicon layer is caused to diffuse into the base 408 thereby forming the emitter 411. Subsequently, the second polycrystalline silicon layer is patterned to form the emitter-extracting electrode 412, thus finishing the main manufacturing step for forming the main portion of the device.

Since an epitaxial growth is employed for the formation of the base 408 in this example as in the third example mentioned above, it is possible to sufficiently minimize the thickness of the base 408 as compared with the conventional method utilizing an ion implantation or diffusion, thereby making it possible to further improve the high speed operation of a bipolar transistor.

Figure 8:
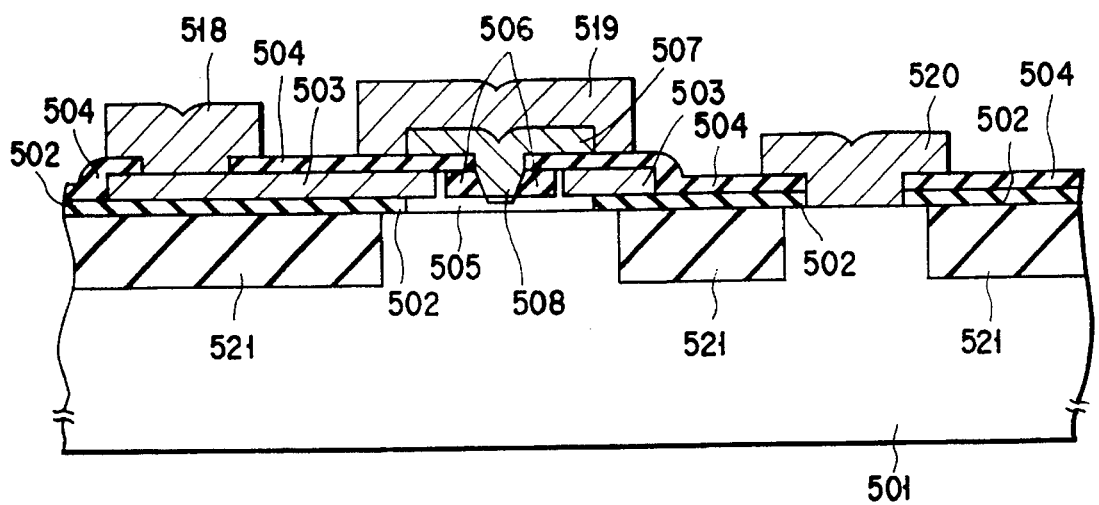
FIG. 8 is a cross-sectional view illustrating the structure of a bipolar transistor according to a fifth example of this invention.

FIG. 8 is a cross-sectional view illustrating the structure of a bipolar transistor according to a fifth example of this invention; and FIGS. 9A to 9D and FIGS. 10A to 10D respectively show cross-sectional views illustrating the manufacturing steps for forming a main portion (emitter and base) of a bipolar transistor shown in FIG. 8.

Figure 9A:
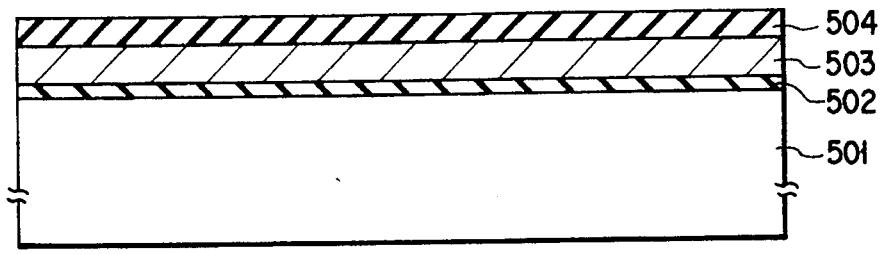
FIGS. 9A to 9D are show cross-sectional views illustrating the first half manufacturing steps for forming a main portion (emitter and base) of a bipolar transistor according to a fifth example of this invention.

First, referring to FIG. 9A, a silicon oxide layer 502, a polycrystalline silicon layer 503 that is to become a base-extracting electrode, and an insulating layer 504 are successively formed on an n-type silicon substrate 501. The silicon oxide layer 502 can be formed by means of a thermal oxidation method or a CVD method for example. The thickness of the silicon oxide layer 502 should preferably be about twice as thick as that of an epitaxial layer for forming a base 505 to be formed in a subsequent step. Because, as explained in the previous example, the growth rate of an epitaxial layer growing upward from the substrate is almost the same as that of an epitaxial layer growing downward from the base-extracting electrode.

Specifically, when the epitaxial layer for forming a base 505 is 50 nm thick, the thickness of the silicon oxide layer 502 may be about 100 nm. Preferably, in view of providing a margin for fully allowing a contact between a base-extracting electrode 503 to be formed in a subsequent step and the base 505, the thickness of the silicon oxide layer 502 should be around 50 nm.

The polycrystalline silicon layer 503 that is to become a base-extracting electrode should be of the same conductive type as that of the base (in this example, a p-type). The adjustment of conductive type of the polycrystalline silicon layer may be performed by means of an ion implantation method or through an in-situ doping at the occasion of forming (growing) the layer. The thickness of the polycrystalline silicon layer 503 should be such that the over-hung portion to be formed therein in a subsequent step can be fully buried with an insulating layer 506. In view of this, the thickness of the polycrystalline silicon layer 503 should be about 200 nm for example.

The material for the insulating layer 504 should be selected from those which are capable of exhibiting a substantial etching selectivity ratio in relative to other layers during the side etching process of the polycrystalline silicon layer 503 as well as during the side etching process of the silicon oxide layer 502. For example, a silicon oxide film ($Si_xN_y$) is desirable as a material for the insulating layer 504. The thickness of the insulating layer 504 may be suitably selected as long as it is strong enough such that it would not be broken even when it is left as an over-hung portion. A suitable thickness of the insulating layer 504 may be about 100 nm for example.

Figure 9B:
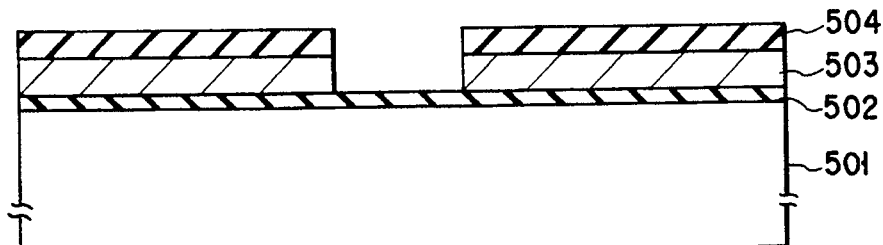

In the next step shown FIG. 9B, parts of the insulating layer 504 and the polycrystalline silicon layer 503 which are disposed over an emitter-forming region are etched away to form an opening.

Figure 9C:
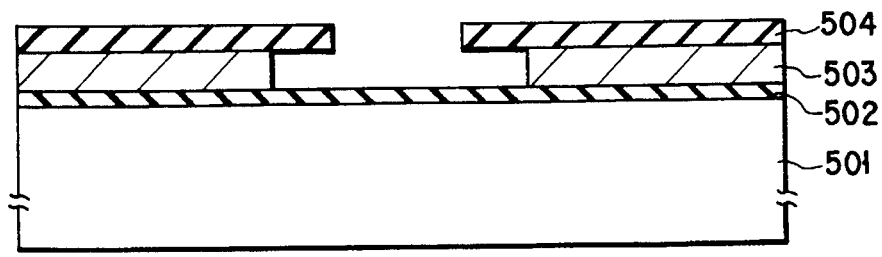

Then, as shown in FIG. 9C, part of the polycrystalline silicon layer 503 is selectively etched away to form a base-extracting electrode 503, and at the same time to form a first over-hung underneath the insulating layer 504. In this case, when the insulating layer 504 is formed of a silicon nitride layer, the etching selective ratio of the polycrystalline silicon layer 503 in relative to the insulating layer 504 and silicon oxide layer 502 (the polycrystalline silicon layer 503/the insulating layer 504; and the polycrystalline silicon layer 503/the silicon oxide layer) can be sufficiently enhanced, provided that the etching of the polycrystalline silicon layer 503 is performed by means of CDE.

In the step shown in FIG. 9B, an opening is formed in insulating layer 504 and the polycrystalline silicon layer 503. However, it is also possible to form an opening only in the insulating layer 504 in the step of FIG. 9B, and then to form an opening in the polycrystalline silicon layer 503 in simultaneous with the etching process of the polycrystalline silicon layer 503 in the step of FIG. 9C by means of CDE.

Thereafter, the silicon oxide layer 502 is selectively etched to expose the surface of part of the silicon substrate 501 that is to become a collector region, and at the same time to form a second over-hung portion underneath the base-extracting electrode 503. In this etching process, a wet type etching such as a hydrofluoric acid-based etching solution such as $NH_4F$, if the insulating layer 504 is formed of a silicon nitride layer, may be employed so as not to give a damage to the silicon substrate 501.

If this kind of etching method is employed, the etching selectivity ratio of the silicon oxide layer 502 in relative to the polycrystalline silicon layer 503 and the insulating layer 504 can be sufficiently enhanced.

By the way, the depth of the over-hung portion may be easily controlled by controlling the etching time.

Figure 10A:
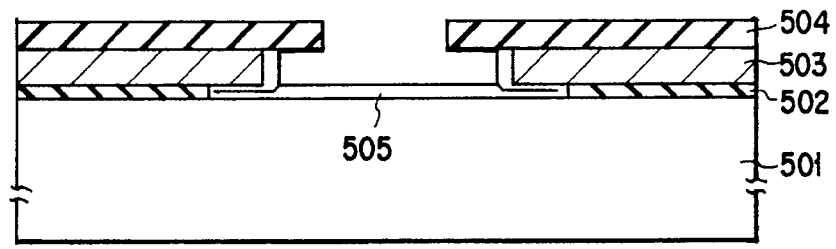
FIGS. 10A to 10D are show cross-sectional views illustrating the latter half manufacturing steps for forming a main portion (emitter and base) of a bipolar transistor according to a fifth example of this invention.

An epitaxial layer that is to become a base 505 is then selectively grown from the silicon substrate 501 and the polycrystalline silicon layer 503 as shown in FIG. 10A. During this step, the base-extracting electrode 503 and part of the silicon substrate 501 disposed over the collector region are contacted with each other at the regions of the first and second over-hung portions.

Figure 10B:
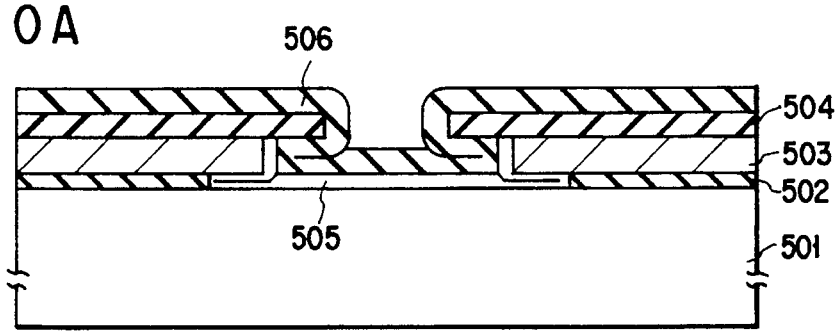
Figure 10C:
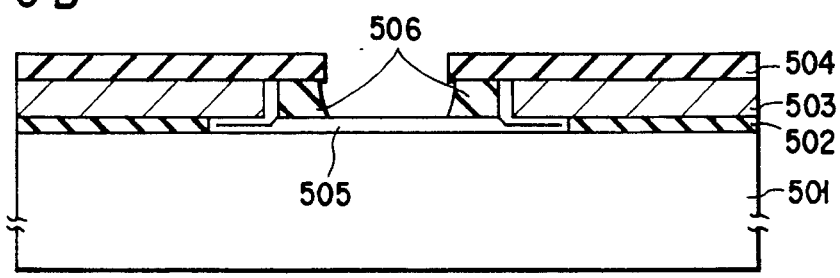

Then, an insulating layer 506 is deposited all over the resultant substrate in such a manner as to completely bury the second over-hung portion as shown in FIG. 10B. As for this insulating layer 506, a LPCVD oxide layer may be employed for example by making use of TEOS-based source gas. The thickness of this insulating layer 506 should be at least a half of the height of a space formed below the over-hung portion (the height of the space is determined depending on the thickness of the polycrystalline silicon layer 503) for burying the second over-hung portion. In this example, a thickness of about 150 nm may be sufficient for the insulating layer 506 in view of the thicknesses of other layers.

This insulating layer 506 is then etched in such a manner that the insulating layer 506 is left only in the second over-hung portion thereby forming a side wall 506. This side wall 506 functions to isolate the base-extracting electrode 503 from the emitter-extracting electrode 507 to be formed in a subsequent step.

The etching process to be employed for forming the side wall 506 is performed by making use of a wet-type etching in order to prevent the epitaxial layer constituting the base 505 from being damaged. For example, if the insulating layer 506 is formed of a silicon oxide layer, a hydrofluoric acid-based etching solution such as NH$_4$F may be suitably employed.

Although it is also possible to employ RIE for forming the side wall 506, an exposed underlying portion, in particular an epitaxial layer constituting the base 505 may be damaged, thus deteriorating the characteristics of the epitaxial layer.

When RIE is employed, it is very difficult to control the shape of the side wall, i.e. the control of in-plane uniformity or the conditioning for shaping becomes very difficult, so that a pattern-dependency (such as the size of an opening) may become more conspicuous. In the case of a wet etching however, it is possible to perform an etching which is excellent in reproducibility and in-plane uniformity only if the composition, concentration and temperature of an etching solution are controlled. Additionally, the apparatus for carrying out a wet etching is very cheap as compared with an RIE apparatus.

Figure 10D:
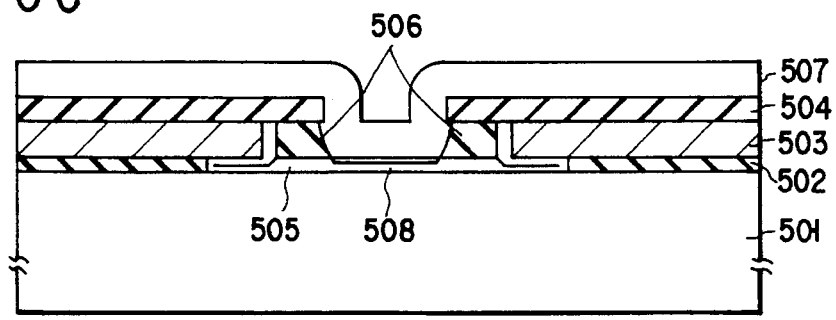
Figure 11A:
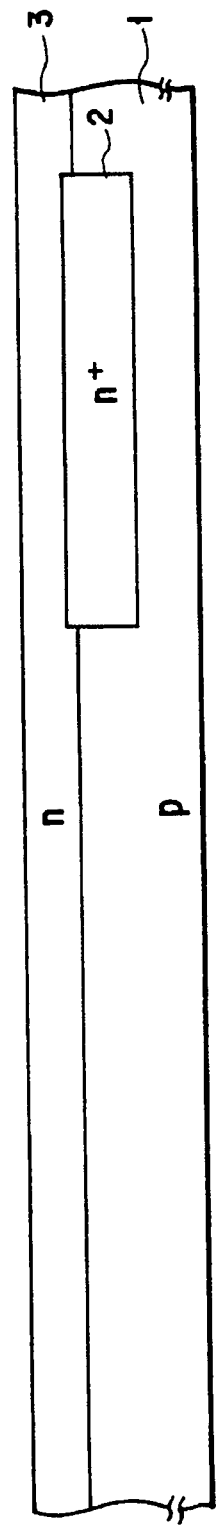
FIGS. 11A, 11B and 11C show cross-sectional views illustrating the first half manufacturing steps of a conventional high speed BiCMOS.
Figure 11B:
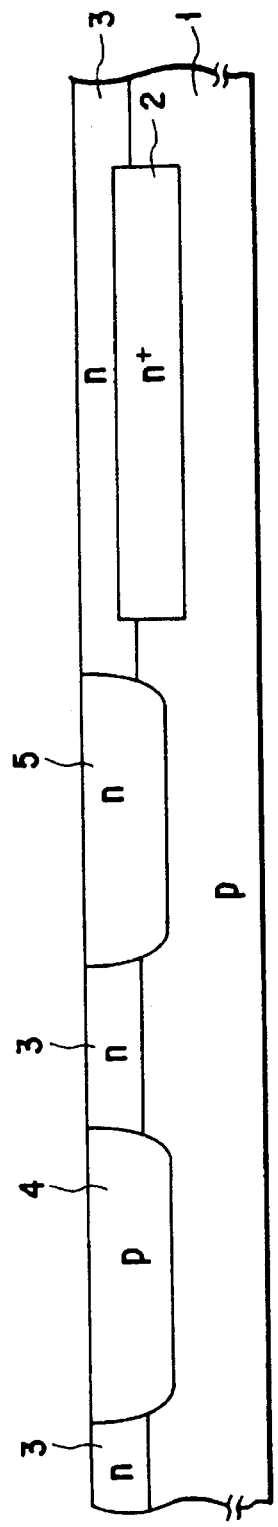
Figure 11C:
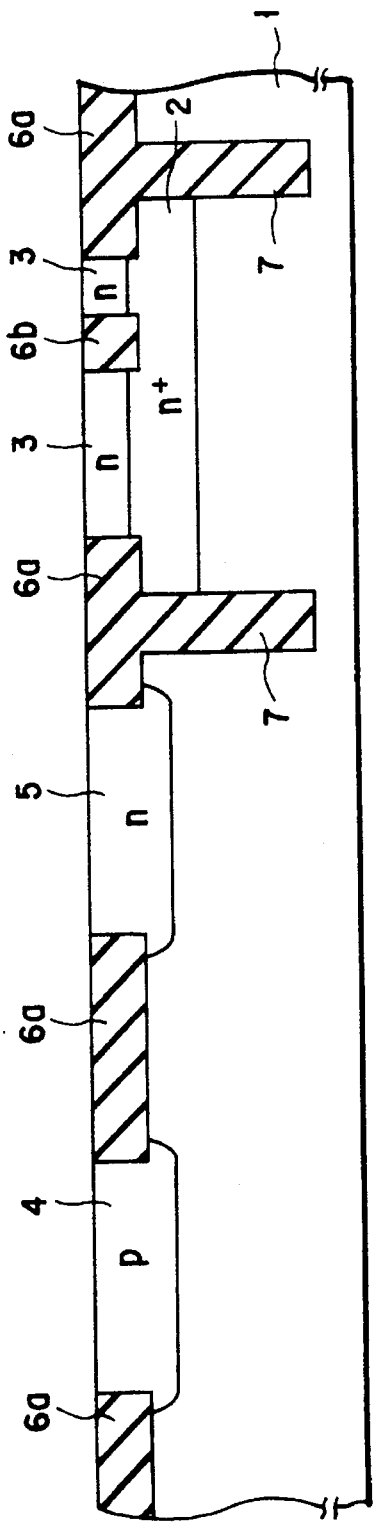
Figure 12A:
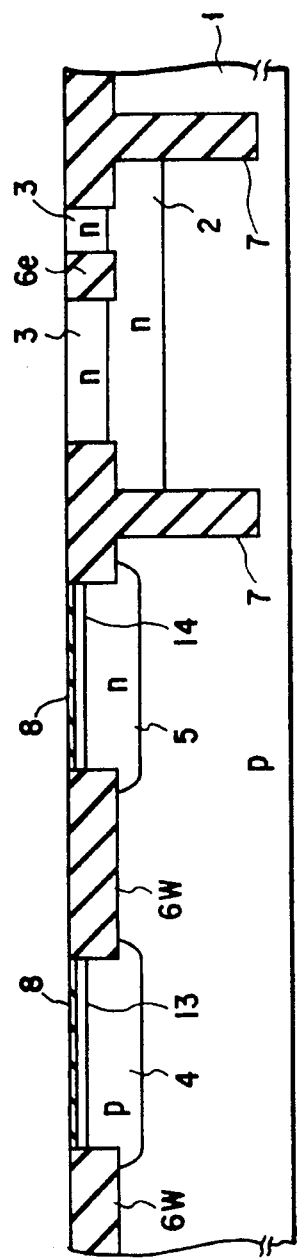
FIGS. 12A, 12B and 12C show cross-sectional views illustrating the intermediate manufacturing steps of a conventional high speed BiCMOS.
Figure 12B:
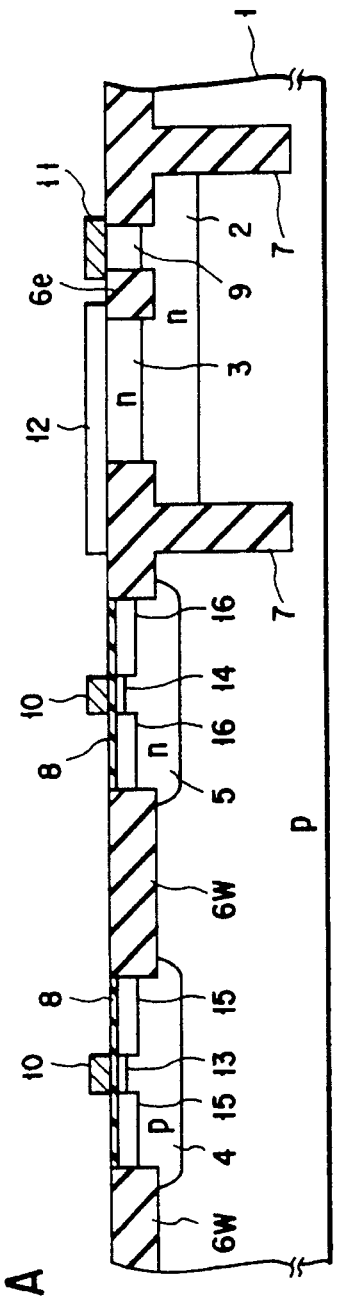
Figure 12C:
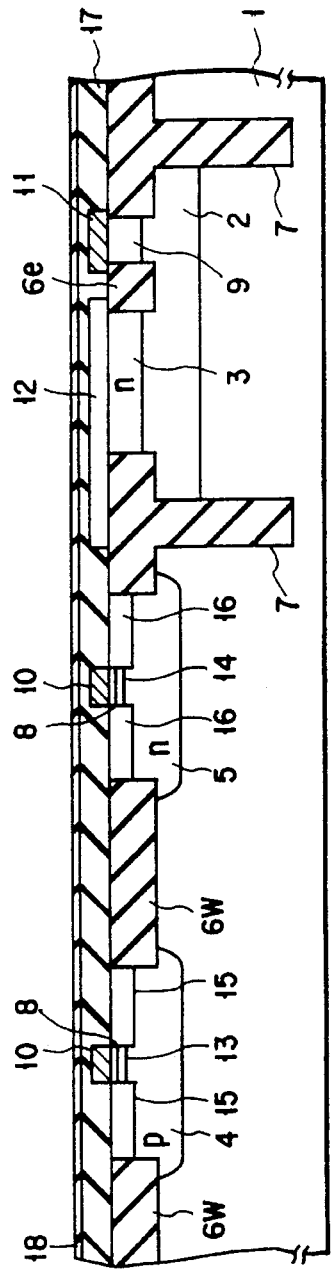
Figure 13A:
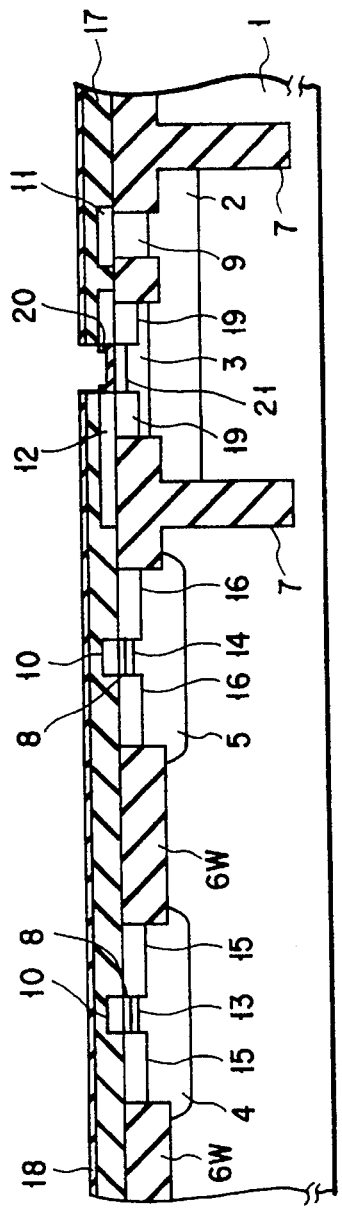
FIGS. 13A, 13B and 13C show cross-sectional views illustrating the latter half manufacturing steps of a conventional high speed BiCMOS.
Figure 13B:
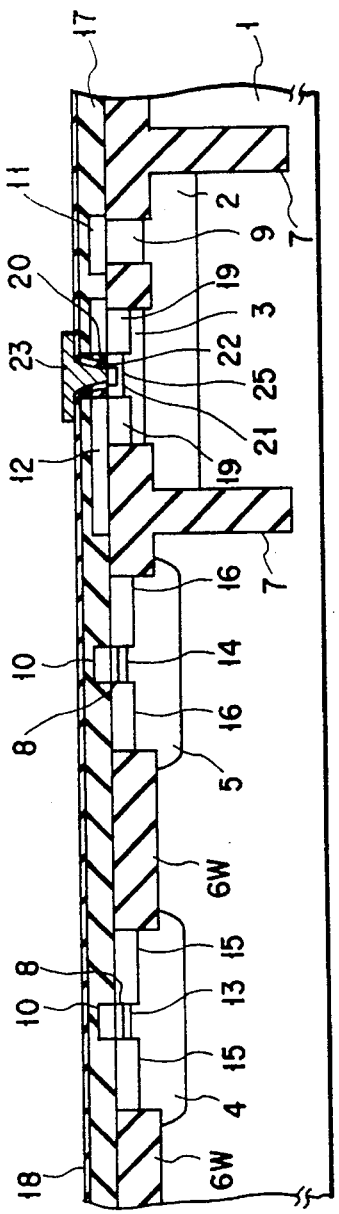
Figure 13C:
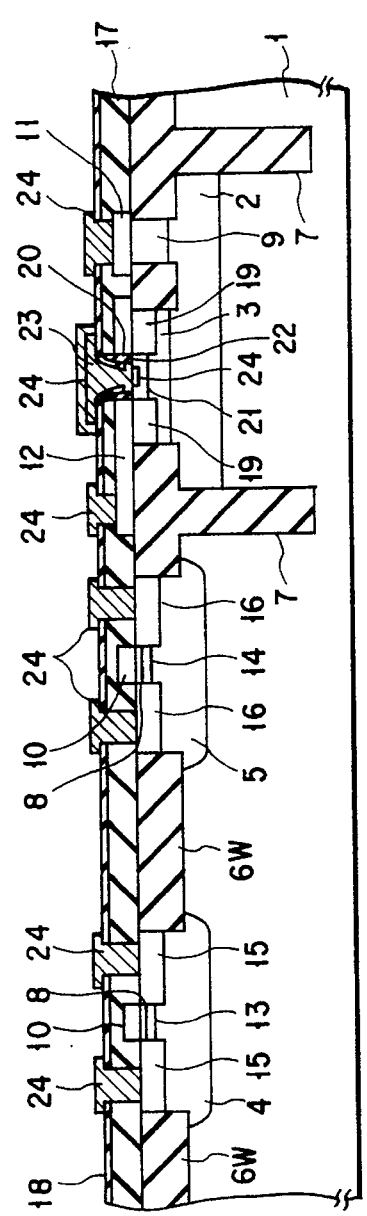
Figure 14:
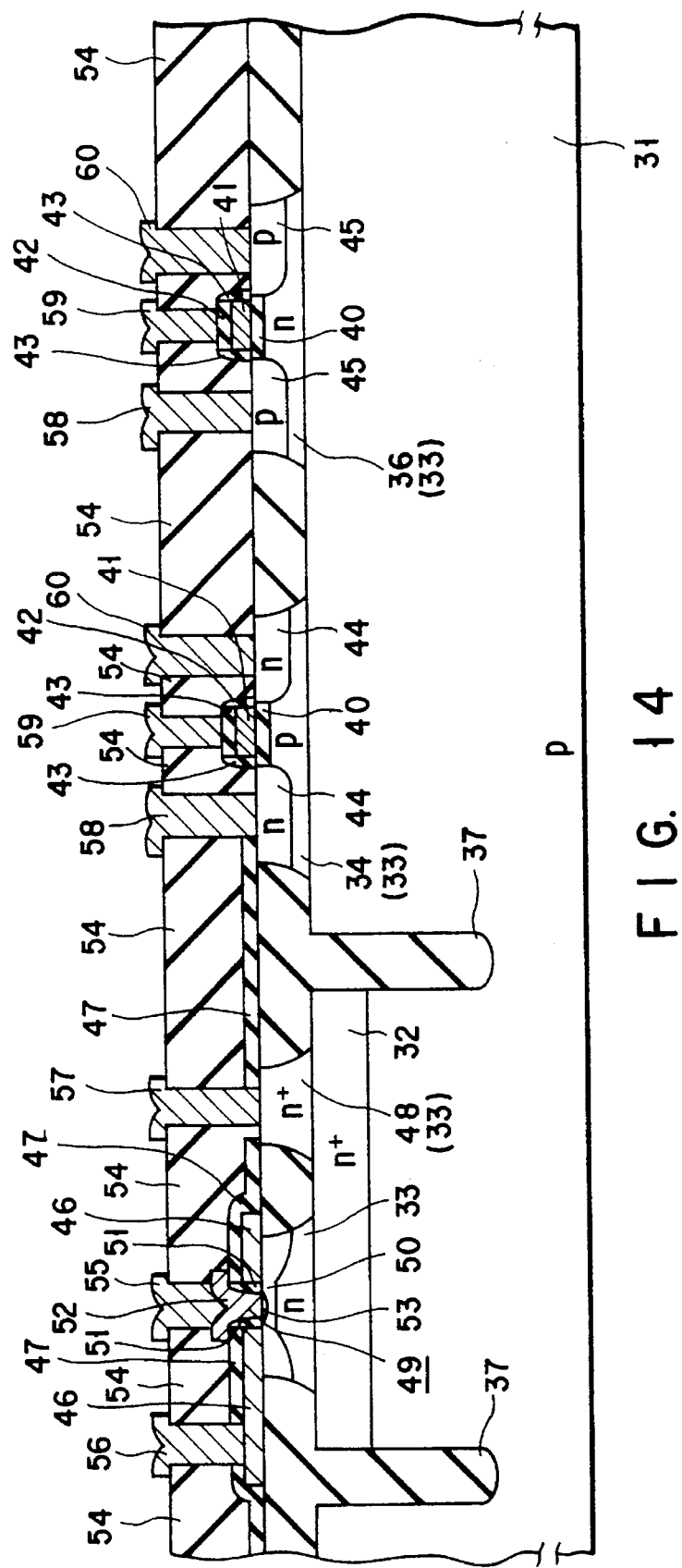
FIG. 14 shows a cross-sectional view illustrating the structure of another conventional high speed BiCMOS.

An n-type polycrystalline silicon layer 507 that is to become an emitter-extracting electrode is then deposited all over the resultant substrate as shown in FIG. 10D, and an n-type impurity contained in the n-type polycrystalline silicon layer 507 is diffused through a thermal treatment into an emitter 508. The formation of this n-type polycrystalline silicon layer 507 may be made by doping an n-type impurity, by way of ion implantation or in-situ doping, into a polycrystalline silicon layer deposited in advance.

Instead of forming an emitter through a diffusion of impurity from the n-type polycrystalline silicon layer 507, it is also possible to directly deposit an emitter on the base 505 by way of epitaxial growth after forming an opening in a region in which the emitter is to be formed. Since the epitaxial layer constituting the base 505 is free from any damage in this case also, it is possible to form an emitter (an epitaxial layer) having an excellent crystallinity.

Finally, after the formation of contact holes, a conductive layer is deposited all over the resultant substrate and patterned thereby forming a base electrode 509 and an emitter electrode 510, a collector 511, thus accomplishing the basic structure of a bipolar transistor. The reference numeral 521 shown in FIG. 8 indicates a trench isolating insulating layer.

Figure 9D:
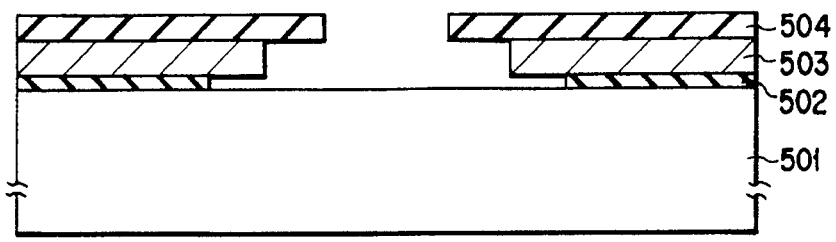

According to the manufacturing method of the fifth example, since the silicon oxide layer 502 is removed by means of wet etching in the step of FIG. 9D, the surface of the silicon substrate 501 to be utilized as a seed crystal for an epitaxial growth is free from any damage, thus making it possible to form a thin epitaxial layer of high quality for forming the base 505. Moreover, since the side wall 506 is formed by etching an insulating layer through a wet etching method in the step of FIG. 10C, there is no possibility to give a damage to the thin epitaxial layer of high quality for forming the base 505. Therefore, the characteristics of the epitaxial layer can be fully retained in the formation of a very thin base of high concentration, whereby a bipolar transistor of higher operation speed and higher f$_T$ (current gain-bandwidth product) can be obtained.

The main structural feature of the bipolar transistor according to this example resides in that an epitaxial layer that is to become the base 505 is buried at the second over-hung portion underneath the base-extracting electrode 503, and the side wall 506 is buried at the first over-hung portion underneath the insulating film 504.

This example is explained with reference to the case where an epitaxial layer is employed as a base of a bipolar transistor. However, this example can be applied to a MOS transistor where the channel thereof is to be formed of an epitaxial layer. Namely, when the insulating layer that is to become a side wall is etched to form the side wall in this example, the surface of the epitaxial layer that is to become a channel region is simultaneously allowed to expose through the etching, and then a gate oxide film and a polycrystalline silicon layer functioning as a gate electrode are successively formed on this exposed surface of the epitaxial layer, thereby forming a recess-type gate electrode. In this manner, a channel region of high quality can be formed, since the epitaxial layer is free from any damage.

Next, a method of manufacturing a BiCMOS according to a sixth example of this invention will be explained. This example is a combination of the second and the third examples.

Following the step of FIG. 6B, the nitride layer 302 of the CMOS portion manufactured in the same process is removed. Subsequently, a bipolar transistor is formed according to the processes beginning from FIG. 4A.

Specifically, the nitride layer 302 of the CMOS portion is removed after the step of FIG. 6B. Then, a first insulating layer that is to become a gate oxide layer 211 and a first conductive layer that is to become a gate electrode 214 and a base-extracting electrode are successively formed all over the resultant substrate. Thereafter, the first conductive layer and the first insulating layer are etched away in such a manner as to leave the gate oxide layer 211 and the gate electrode 214. In this case, the first insulating layer and the first conductive layer disposed over a region for forming a bipolar transistor are left as they are without being patterned. Then, a second insulating layer is deposited all over the resultant substrate thereby forming a structure which is the same as that of FIG. 4B.

The subsequent main steps to be followed are the same as those of the second example. Namely, after an over-hung portion is formed, a base is formed by means of an epitaxial growth. Then, a second conductive layer corresponding to the n-type polycrystalline silicon layer 223 is deposited all over the resultant substrate. Subsequently, the n-type impurity contained in this second conductive layer is diffused into the base to form an emitter.

The second example may be combined with the fourth example instead of the third example.

Next, a method of manufacturing a BiCMOS according to a seventh example of this invention will be explained. This example is a combination of the second and the fifth examples.

Following the step of FIG. 4B, a bipolar transistor is manufactured according to the processes shown in FIGS. 9 and 10, wherein the silicon oxide layer 212 is regarded as being a silicon oxide layer 502 (a first insulating layer), the base-extracting electrode 213 is regarded as being a base-extracting electrode 503 (a first conductive layer), and the silicon oxide layer 215 is regarded as being an insulating layer 504 (a second insulating layer)

The subsequent main steps to be followed are the same as those of the fifth example. Namely, after a first and second over-hung portions are formed, a base is formed by means of an epitaxial growth. Then, a third insulating layer corresponding to the insulating layer 506 is deposited all over the resultant substrate. Thereafter, this third insulating layer is etched in such a manner as to have the second over-hung portion buried with this third insulating layer. Then, a second conductive layer corresponding to the n-type polycrystalline silicon layer 507 is deposited all over the resultant substrate, and thereafter, heat-treated to diffuse the n-type impurity contained in the second conductive layer into the base to form an emitter.

The third example may be combined with the fifth example instead of the second example.

According to this invention, since the region for forming a CMOS transistor is isolated by an oxide layer which is formed through a selective oxidation of the surface of a semiconductor substrate from the region for forming a bipolar transistor, it is possible to prevent a leak current resulting from a crystal defect which may be generated when a trench isolating insulating layer is employed.

Further, according to this invention, a manufacturing process is proceeded while leaving a first oxide layer and a second oxide layer for constituting a gate oxide layer remained in a region for forming a bipolar transistor, in other words, while the manufacturing process for forming a bipolar transistor and the manufacturing process for forming a CMOS transistor are substantially simultaneously proceeded. Therefore, there is no need to separately form a bipolar transistor after the formation of a MOS transistor, thus making it possible to avoid the complication and increase in number of the manufacturing steps.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of manufacturing a semiconductor device, which comprises the steps of:

forming selectively an element-isolating insulating layer on a surface of a semiconductor substrate to define a second conductive type active region that is to become a first conductive type MOS transistor, a first active region of a first conductive type that is to become a second conductive type MOS transistor, and a second active region of the first conductive type that is to become a bipolar transistor;

forming a first insulating layer on each of a surface of said second conductive type active region, a surface of said first active region of the first conductive type and a surface of said second active region of the first conductive type, said forming a first insulating layer step comprising removing portions of said first insulating layer disposed on the respective surfaces of said second conductive type active region and of said first active region of a first conductive type;

oxidizing the respective surfaces of said second conductive type active region and said first active region of a first conductive type to form a first oxide layer constituting a gate oxide layer;

forming a gate electrode of said first conductive type MOS transistor, a gate electrode of said second conductive type MOS transistor and a base-extracting electrode of said bipolar transistor, comprising the steps of, forming a conductive layer disposed above and over all of the surface of said semiconductor substrate, and patterning said conductive layer to form the respective gate electrodes and said base-extracting electrode;

forming in said base extracting electrode an opening extending to a surface of said first insulating layer, comprising the steps of, etching a portion of said base-extracting electrode disposed over a region that is to become an emitter, and forming a side wall insulating layer on an inner wall of said opening;

removing a first portion of said first insulating layer disposed on a bottom of said opening and a second portion of said first insulating layer disposed around said bottom of said opening, thereby forming an overhung portion underneath said base-extracting electrode;

epitaxially growing a second conductive type semiconductor layer that is to become a base by making use of said base-extracting electrode exposed at said overhung portion as well as making use of said second active region of a first conductive type as a seed crystal, said second conductive type semiconductor layer grown to such an extent as to bury said overhung portion; and selectively forming a first conductive type semiconductor layer that is to become an emitter on a surface of said second conductive type semiconductor layer such that said first conductive type semiconductor layer does not contact said base-extracting electrode.

2. The method of manufacturing a semiconductor device according to claim 1, wherein said step of forming a first insulator step comprises forming the first insulating layer which comprises a nitride layer.

3. The method of manufacturing a semiconductor device according to claim 1, wherein said step of forming a first insulator step comprises forming the first insulating layer which comprises an oxide layer.

4. A method of manufacturing a semiconductor device, which comprises the steps of;

forming an element-isolating insulating layer on a surface of a semiconductor substrate whereby to form a second conductive type active region that is to become a first conductive type MOS transistor of a CMOS transistor and a first active region of a first conductive type that is to become a second conductive type MOS transistor of a CMOS transistor, and to form a second active region of a first conductive type that is to become a bipolar transistor;

forming a first oxide layer on a surface of said second conductive type active region, a surface of said first active region of a first conductive type and a surface of said second active region of a first conductive type by oxidizing these surfaces, and removing a portion of said first oxide layer that is disposed on the surfaces of said second conductive type active region and of said first active region of a first conductive type;

oxidizing the surfaces of said second conductive type active region, said first active region of a first conductive type and said second active region of a first conductive type, thus forming a second oxide layer constituting a gate oxide layer, and then forming a conductive layer all over the surface of said semiconductor substrate;

forming a gate electrode of said second conductive type MOS transistor, a gate electrode of said first conductive type MOS transistor and a base-extracting electrode by patterning said conductive layer;

forming a first insulating layer all over the surface of said semiconductor substrate, and then forming an opening extending to a surface of said second oxide layer by etching parts of said base-extracting electrode and said first insulating layer disposed over a region that is to become an emitter removing part of said base-extracting electrode which is formed on a wall of said opening, thereby forming a first overhung portion underneath said first insulating layer;

removing, by way of wet-etching, not only all of said first oxide layer and second oxide layer disposed on a bottom of said opening but also part of said first oxide layer and said second oxide layer disposed around said bottom of opening, thereby forming a second overhung portion underneath said base-extracting electrode;

epitaxially growing a second conductive type semiconductor layer that is to become a base by making use of said base-extracting electrode exposed at said first and second overhung portions and as well as making use of said second active region of a first conductive type exposed to said second overhung portion and said opening as a seed crystal to such an extent as to bury said second overhung portion;

forming a second insulating layer all over the surface of said semiconductor substrate, and then wet-etching said second insulating layer in such a manner as to leave said second insulating layer only in said first overhung portion; and forming a second conductive layer containing a first conductive type impurity all over the surface of said semiconductor substrate, and then diffusing said first conductive type impurity into the surface of said second conductive type semiconductor layer by way of a thermal treatment thereby forming the emitter.

* * * * *